United States Patent
Elias et al.

(10) Patent No.: US 9,569,053 B2
(45) Date of Patent: Feb. 14, 2017

(54) WIDE DYNAMIC RANGE CAPACITIVE SENSING

(71) Applicant: Apple Inc., Cupertino, CA (US)

(72) Inventors: John Greer Elias, Townsend (DE); Steven P. Hotelling, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/788,642

(22) Filed: Jun. 30, 2015

(65) Prior Publication Data

US 2015/0324062 A1    Nov. 12, 2015

Related U.S. Application Data

(63) Continuation of application No. 13/460,620, filed on Apr. 30, 2012, now Pat. No. 9,201,547.

(51) Int. Cl.
*G06F 3/044* (2006.01)
*G06F 3/041* (2006.01)
*H03K 17/955* (2006.01)

(52) U.S. Cl.
CPC .......... *G06F 3/044* (2013.01); *G06F 3/0418* (2013.01); *H03K 17/955* (2013.01); *G06F 2203/04101* (2013.01); *G06F 2203/04107* (2013.01)

(58) Field of Classification Search
CPC ............ G06F 2203/04101; G06F 2203/04107; G06F 3/0418; G06F 3/044; H03K 17/955
USPC ........................................................ 345/173
See application file for complete search history.

(56) References Cited

U.S. PATENT DOCUMENTS

| | | |
|---|---|---|
| 4,603,231 A | 7/1986 | Reiffel et al. |
| 5,402,151 A | 3/1995 | Duwaer |
| 5,483,261 A | 1/1996 | Yasutake |
| 5,488,204 A | 1/1996 | Mead et al. |
| 5,825,352 A | 10/1998 | Bisset et al. |
| 5,835,079 A | 11/1998 | Shieh |
| 5,880,411 A | 3/1999 | Gillespie et al. |
| 6,137,427 A | 10/2000 | Binstead |
| 6,188,391 B1 | 2/2001 | Seely et al. |
| 6,310,610 B1 | 10/2001 | Beaton et al. |

(Continued)

FOREIGN PATENT DOCUMENTS

| | | |
|---|---|---|
| CN | 101393502 A | 3/2009 |
| FR | 2 949 007 | 2/2011 |

(Continued)

OTHER PUBLICATIONS

Notice of Allowance mailed Dec. 17, 2015, for U.S. Appl. No. 12/501,382, filed Jul. 10, 2009, five pages.

(Continued)

*Primary Examiner* — Viet Pham
(74) *Attorney, Agent, or Firm* — Morrison & Foerster LLP

(57) ABSTRACT

A touch sensor panel configured to detect objects touching the panel as well as objects that are at a varying proximity to the touch sensor panel. The touch sensor panel includes circuitry that can configure the panel in a mutual capacitance (near field) architecture or a self-capacitance (far field and super far field) architecture. The touch sensor panel can also include circuitry that works to minimize an effect that a parasitic capacitance can have on the ability of the touch sensor panel to reliably detect touch and proximity events.

21 Claims, 21 Drawing Sheets

(56) References Cited

U.S. PATENT DOCUMENTS

| | | |
|---|---|---|
| 6,323,846 B1 | 11/2001 | Westerman et al. |
| 6,335,642 B1 | 1/2002 | Hiroshima et al. |
| 6,650,157 B2 | 11/2003 | Amick et al. |
| 6,690,387 B2 | 2/2004 | Zimmerman et al. |
| 7,015,894 B2 | 3/2006 | Morohoshi |
| 7,084,643 B2 | 8/2006 | Howard et al. |
| 7,184,064 B2 | 2/2007 | Zimmerman et al. |
| 7,315,793 B2 | 1/2008 | Jean |
| 7,663,607 B2 | 2/2010 | Hotelling et al. |
| 8,149,002 B2 | 4/2012 | Ossart et al. |
| 8,479,122 B2 | 7/2013 | Hotelling et al. |
| 8,770,033 B2 | 7/2014 | Roziere |
| 8,913,021 B2 | 12/2014 | Elias et al. |
| 8,933,710 B2 | 1/2015 | Blondin et al. |
| 9,086,768 B2 | 7/2015 | Elias et al. |
| 9,201,547 B2 | 12/2015 | Elias et al. |
| 9,268,431 B2 | 2/2016 | King et al. |
| 9,323,398 B2 | 4/2016 | Bernstein et al. |
| 2002/0121146 A1 | 9/2002 | Manaresi et al. |
| 2004/0217945 A1 | 11/2004 | Miyamoto et al. |
| 2006/0071913 A1 | 4/2006 | Wang et al. |
| 2006/0197749 A1 | 9/2006 | Popovich |
| 2006/0197753 A1 | 9/2006 | Hotelling |
| 2007/0074913 A1 | 4/2007 | Geaghan et al. |
| 2007/0109274 A1 | 5/2007 | Reynolds |
| 2007/0152977 A1 | 7/2007 | Ng et al. |
| 2008/0007533 A1 | 1/2008 | Hotelling |
| 2008/0007543 A1 | 1/2008 | D'Souza |
| 2008/0012835 A1 | 1/2008 | Rimon et al. |
| 2008/0041639 A1 | 2/2008 | Westerman et al. |
| 2008/0042660 A1 | 2/2008 | Ely et al. |
| 2008/0062148 A1 | 3/2008 | Hotelling et al. |
| 2008/0122798 A1 | 5/2008 | Koshiyama et al. |
| 2008/0143683 A1 | 6/2008 | Hotelling |
| 2008/0158172 A1* | 7/2008 | Hotelling .............. G06F 1/3231 345/173 |
| 2008/0158174 A1 | 7/2008 | Land et al. |
| 2008/0174321 A1 | 7/2008 | Kang et al. |
| 2008/0231292 A1 | 9/2008 | Ossart et al. |
| 2008/0309632 A1 | 12/2008 | Westerman et al. |
| 2009/0009483 A1 | 1/2009 | Hotelling et al. |
| 2009/0045823 A1 | 2/2009 | Tasher et al. |
| 2009/0128515 A1 | 5/2009 | Bytheway |
| 2009/0167325 A1 | 7/2009 | Geaghan |
| 2009/0174675 A1 | 7/2009 | Gillespie et al. |
| 2009/0219255 A1 | 9/2009 | Woolley et al. |
| 2009/0234207 A1 | 9/2009 | Rantala |
| 2009/0251434 A1 | 10/2009 | Rimon |
| 2009/0251439 A1 | 10/2009 | Westerman et al. |
| 2009/0289914 A1 | 11/2009 | Cho |
| 2009/0309851 A1* | 12/2009 | Bernstein .............. G06F 3/0416 345/174 |
| 2010/0026656 A1 | 2/2010 | Hotelling et al. |
| 2010/0105443 A1 | 4/2010 | Vaisanen |
| 2010/0110038 A1 | 5/2010 | Mo et al. |
| 2010/0110040 A1 | 5/2010 | Kim et al. |
| 2010/0149126 A1 | 6/2010 | Futter |
| 2010/0241956 A1 | 9/2010 | Matsuda et al. |
| 2010/0253638 A1 | 10/2010 | Yousefpor et al. |
| 2010/0321333 A1 | 12/2010 | Oda et al. |
| 2010/0328262 A1 | 12/2010 | Huang et al. |
| 2011/0007021 A1 | 1/2011 | Berstein |
| 2011/0025629 A1 | 2/2011 | Grivna et al. |
| 2011/0050585 A1 | 3/2011 | Hotelling et al. |
| 2011/0061949 A1 | 3/2011 | Krah et al. |
| 2011/0063247 A1 | 3/2011 | Min |
| 2011/0115729 A1 | 5/2011 | Kremin et al. |
| 2011/0157069 A1 | 6/2011 | Zhuang et al. |
| 2011/0234523 A1 | 9/2011 | Chang et al. |
| 2011/0273395 A1 | 11/2011 | Chung |
| 2011/0273399 A1 | 11/2011 | Lee |
| 2012/0007831 A1 | 1/2012 | Chang et al. |
| 2012/0013399 A1 | 1/2012 | Huang |
| 2012/0043971 A1 | 2/2012 | Maharyta |
| 2012/0050180 A1 | 3/2012 | King et al. |
| 2012/0050333 A1 | 3/2012 | Bernstein |
| 2012/0092288 A1 | 4/2012 | Wadia |
| 2012/0162088 A1 | 6/2012 | Van Lieshout et al. |
| 2012/0176179 A1 | 7/2012 | Harders et al. |
| 2012/0182251 A1 | 7/2012 | Krah |
| 2012/0187965 A1 | 7/2012 | Roziere |
| 2012/0188200 A1 | 7/2012 | Roziere |
| 2012/0262222 A1* | 10/2012 | Schwartz .............. G06F 3/0418 327/517 |
| 2012/0287077 A1* | 11/2012 | Pant ..................... G06F 3/044 345/174 |
| 2013/0038863 A1 | 2/2013 | Fresquet |
| 2013/0285971 A1 | 10/2013 | Elias et al. |
| 2013/0285972 A1 | 10/2013 | Elias et al. |
| 2013/0285973 A1 | 10/2013 | Elias et al. |
| 2013/0314109 A1 | 11/2013 | Kremin et al. |
| 2014/0078096 A1 | 3/2014 | Tan |
| 2014/0085246 A1 | 3/2014 | Shahparnia |
| 2014/0145732 A1 | 5/2014 | Blondin et al. |
| 2014/0145997 A1 | 5/2014 | Tiruvuru |
| 2014/0146006 A1 | 5/2014 | Luong |
| 2014/0240280 A1 | 8/2014 | Ekici |
| 2014/0267165 A1 | 9/2014 | Roziere |
| 2014/0360854 A1 | 12/2014 | Roziere |
| 2015/0002176 A1 | 1/2015 | Kwon |
| 2015/0145802 A1 | 5/2015 | Yao et al. |
| 2016/0209982 A1 | 7/2016 | Bernstein et al. |
| 2016/0259474 A1 | 9/2016 | King et al. |

FOREIGN PATENT DOCUMENTS

| | | |
|---|---|---|
| JP | 2000-163031 A | 6/2000 |
| JP | 2002-342033 A | 11/2002 |
| JP | 2008-117371 A | 5/2008 |
| KR | 10-2009-0017557 | 2/2009 |
| WO | WO-2005/114369 A2 | 12/2005 |
| WO | WO-2005/114369 A3 | 12/2005 |
| WO | WO-2007/130771 A2 | 11/2007 |
| WO | WO-2008/121411 A1 | 10/2008 |
| WO | WO-2009/023880 A2 | 2/2009 |
| WO | WO-2009/023880 A3 | 2/2009 |
| WO | WO-2011/005977 A2 | 1/2011 |
| WO | WO-2011/137200 A1 | 11/2011 |
| WO | WO-2012/027086 A2 | 3/2012 |
| WO | WO-2013/165925 A2 | 11/2013 |

OTHER PUBLICATIONS

Final Office Action mailed Jan. 14, 2016, for U.S. Appl. No. 14/089,418, filed Nov. 25, 2013, 17 pages.

European Search Report mailed Jul. 20, 2015, for EP Application No. 15162455.8, three pages.

Notice of Allowance mailed Aug. 5, 2015, for U.S. Appl. No. 13/460,620, filed Apr. 30, 2012, eight pages.

Cypress. (Apr. 21, 2010). "Cypress's New Hover Detection for TrueTouch™ Touchscreen Solution Indicates Where a Finger Will Touch as It Approaches Screen," Press Release by Cypress Semiconductor Corp., located at <http://www.cypress.com/?rID=42779>, last visited Sep. 28, 2010, two pages.

Final Office Action mailed May 10, 2013, for U.S. Appl. No. 12/501,382, filed Jul. 10, 2009, 23 pages.

Final Office Action mailed Aug. 19, 2013, for U.S. Appl. No. 12/895,643, filed Sep. 30, 2010, 18 pages.

Final Office Action mailed Dec. 5, 2013, for U.S. Appl. No. 12/501,382, filed Jul. 10, 2009, 28 pages.

Final Office Action mailed Aug. 1, 2014, for U.S. Appl. No. 12/501,382, filed Jul. 10, 2009, 42 pages.

Final Office Action mailed Aug. 14, 2014, for U.S. Appl. No. 13/460,620, filed Apr. 30, 2012, 17 pages.

Final Office Action mailed Oct. 14, 2014, for U.S. Appl. No. 13/460,652, filed Apr. 30, 2012, 16 pages.

Final Office Action mailed Mar. 3, 2015, for U.S. Appl. No. 12/895,643, filed Sep. 30, 2010, 22 pages.

International Search Report mailed Apr. 20, 2011, for PCT Application No. PCT/US2010/041391, filed Jul. 8, 2010, six pages.

(56) References Cited

OTHER PUBLICATIONS

International Search Report mailed Aug. 22, 2012, for PCT Application No. PCT/US2011/046814, filed Aug. 5, 2011, three pages.
International Search Report mailed Dec. 17, 2013, for PCT Application No. PCT/US2013/038706, filed Apr. 29, 2013, eight pages.
Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
Non-Final Office Action mailed Oct. 4, 2012, for U.S. Appl. No. 12/501,382, filed Jul. 10, 2009, 20 pages.
Non-Final Office Action mailed Mar. 29, 2013, for U.S. Appl. No. 12/895,643, filed Sep. 30, 2010, 16 pages.
Non-Final Office Action mailed Dec. 24, 2013, for U.S. Appl. No. 13/460,645, filed Apr. 30, 2012, 13 pages.
Non-Final Office Action mailed Jan. 30, 2014, for U.S. Appl. No. 13/460,620, filed Apr. 30, 2012, 14 pages.
Non-Final Office Action mailed Feb. 25, 2014, for U.S. Appl. No. 13/460,652, filed Apr. 30, 2012, 14 pages.
Non-Final Office Action mailed Aug. 15, 2014, for U.S. Appl. No. 12/895,643, filed Sep. 30, 2010, 19 pages.
Non-Final Office Action mailed Apr. 23, 2015, for U.S. Appl. No. 12/501,382, filed Jul. 10, 2009, 32 pages.
Non-Final Office Action mailed May 19, 2015, for U.S. Appl. No. 14/089,418, filed Nov. 25, 2013, 14 pages.
Notice of Allowance mailed Aug. 15, 2014, for U.S. Appl. No. 13/460,645, filed Apr. 30, 2012, seven pages.
Notice of Allowance mailed Mar. 16, 2015, for U.S. Appl. No. 13/460,620, filed Apr. 30, 2012, seven pages.
Notice of Allowance mailed Apr. 13, 2015, for U.S. Appl. No. 13/460,652, filed Apr. 30, 2012, seven pages.
Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.
Rubine, D.H. (May 1992). "Combining Gestures and Direct Manipulation," CHI '92, pp. 659-660.
U.S. Appl. No. 12/501,382, filed Jul. 10, 2009, by Bernstein et al.
Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.
Notice of Allowance mailed Oct. 6, 2015, for U.S. Appl. No. 12/895,643, filed Sep. 30, 2010, eight pages.
Chinese Search Report dated May 23, 2016, for CN Application No. 201380022713.1, filed Apr. 29, 2013, two pages.

\* cited by examiner

WIDE DYNAMIC RANGE CAPACITIVE SENSING

CROSS-REFERENCE TO RELATED APPLICATIONS

This is a continuation of U.S. patent application Ser. No. 13/460,620, filed Apr. 30, 2012, and published on Oct. 31, 2013 as U.S. Publication No. 2013/0285971, the content of which is herein incorporated by reference in its entirety for all purposes.

FIELD OF THE DISCLOSURE

This relates generally to the detection of touch and proximity events on touch sensor panels, and more particularly, to the implementation of a touch sensor panel that can sense touch and proximity events over a wide dynamic range of distances.

BACKGROUND OF THE DISCLOSURE

Many types of input devices are available for performing operations in a computing system, such as buttons or keys, mice, trackballs, joysticks, touch sensor panels, touch screens, and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens generally allow a user to perform various functions by touching (e.g., physical contact or near-field proximity) the touch sensor panel using a finger, stylus or other object at a location often dictated by a user interface (UI) being displayed by the display device. In general, touch screens can recognize a touch event and the position of the touch event on the touch sensor panel, and the computing system can then interpret the touch event in accordance with the display appearing at the time of the touch event, and thereafter can perform one or more actions based on the touch event.

Mutual capacitance touch sensor panels can be formed from a matrix of drive and sense lines of a substantially transparent conductive material such as Indium Tin Oxide (ITO). The lines are often arranged orthogonally on a substantially transparent substrate. Mutual capacitance touch sensor panels not only have the ability to detect touch events on the touch sensor panels, but also have the ability to detect proximity events, in which an object is not touching the panel but is in close proximity to the panel. However, mutual capacitance touch pads are constrained in their ability to sense proximity events, and thus only provide proximity detection over a limited range of distances from the touch sensor panel.

SUMMARY OF THE DISCLOSURE

This relates to a touch sensor panel configured to detect objects that either are touching the panel or at a varying degree of proximity to the touch sensor panel. The panel can be configured to include circuitry that is capable of detecting objects that are touching the panel (near field events) using a mutual capacitance touch detection architecture, or can be configured to detect objects at a varying degree of proximity (far field and super far field) utilizing a projection scanning self-capacitance architecture. Furthermore, in order to facilitate the detection of proximity events at varying distances away from the touch panel, a parasitic capacitance of the touch sensor panel can be reduced to make proximity event detection more reliable as the distance that the object is from the touch sensor panel increases.

DETAILED DESCRIPTION

In the following description of embodiments, reference is made to the accompanying drawings which form a part hereof, and in which it is shown by way of illustration specific embodiments that can be practiced. It is to be understood that other embodiments can be used and structural changes can be made without departing from the scope of the disclosed embodiments.

This relates to a touch sensor panel which can have the ability to not only sense touch events but to also sense proximity events over a wide dynamic range of distances. The touch sensor panel hardware can be switched into various configurations depending on the range of distance that is desired to be sensed. Furthermore, the parasitic capacitance experienced by the touch sensor panel can be mitigated so that it does not act to distort the touch sensor panel's ability to detect touch and proximity events. Driven shielding can be employed to reduce parasitic capacitance, and the parasitic capacitance's effect on phase can be calibrated out to reduce its net effect on touch and proximity detection.

Although embodiments disclosed herein may be described and illustrated herein in terms of mutual capacitance and self-capacitance touch sensor panels, it should be understood that the embodiments are not so limited, but are additionally applicable to any capacitive touch sensor panel in which a wide dynamic range of detection is required. Additionally, although embodiments disclosed herein may be described and illustrated in terms of driven shielding being applied to one or more of a border trace area, a display area and electrodes, it should be understood that the embodiments are not so limited, but may be additionally applicable to any part of a touch input device which contributes parasitic capacitance to sense detection. Furthermore, although embodiments disclosed herein relate to a method of mitigating parasitic capacitance on a touch sensor panel, it should be understood that the embodiments are not so limited, but may be additionally applicable to any capacitive touch sensor device such as a capacitive trackpad.

Figure 1A:
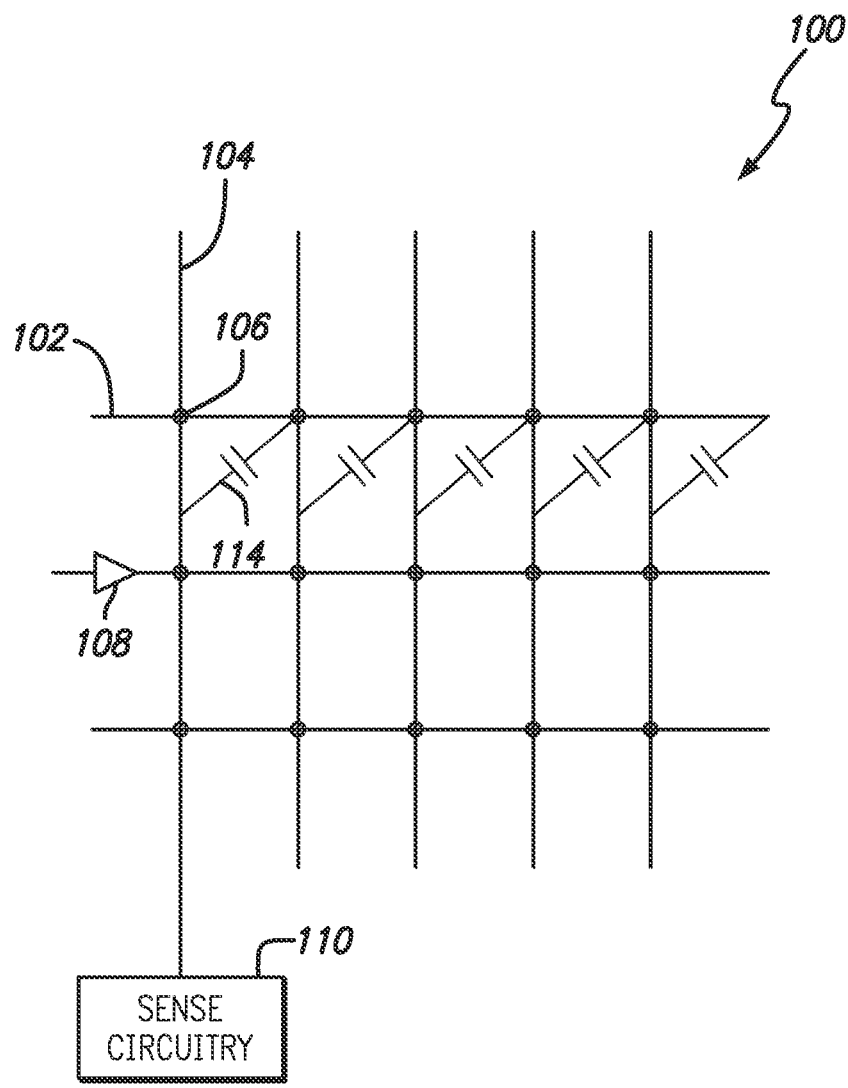
FIG. 1a illustrates an exemplary mutual capacitance touch sensor circuit according to one disclosed embodiment.

FIG. 1a illustrates an exemplary touch sensor panel 100 according to some embodiments of the disclosure. Touch sensor panel 100 can include an array of touch nodes 106 that can be formed by a two-layer electrode structure separated by a dielectric material, although in other embodiments the electrodes can be formed on the same layer. One layer of electrodes can include a plurality of drive lines 102 positioned perpendicular to another layer of electrodes comprising a plurality of sense lines 104, with each of the nodes 106 having an associated mutual capacitance 114 (also referred to as coupling capacitance), although in other embodiments, the drive and sense lines can be positioned in non-orthogonal arrangements. The drive lines 102 and sense lines 104 can cross over each other in different planes separated from one another by a dielectric. Each point in which a drive line 102 intersects a sense line 104 can create a touch node 106. Thus, for example, a panel which contains for instance 20 drive lines 102 and 15 sense lines 104 will have 300 touch nodes available to detect touch or proximity events.

Drive lines 102 (also referred to as rows, row traces, or row electrodes) can be activated by a stimulation signal provided by respective drive circuits 108. Each of the drive circuits 108 can include an alternating current (AC) or unipolar pulsatile voltage source referred to as a stimulation signal source. To sense touch event(s) on the touch sensor panel 100, one or more of the drive lines 102 can be stimulated by the drive circuits 108, and the sense circuitry 110 can detect the resulting change in the charge coupled onto the sense lines 104 in the form of a change in the amplitude of the coupled stimulation signal. The change in voltage amplitude values can be indicative of a finger or conductive object touching or in proximity to the panel. The detected voltage values can be representative of node touch output values, with changes to those output values indicating the node locations 106 where the touch or proximity events occurred and the amount of touch that occurred at those location(s).

Figure 1B:
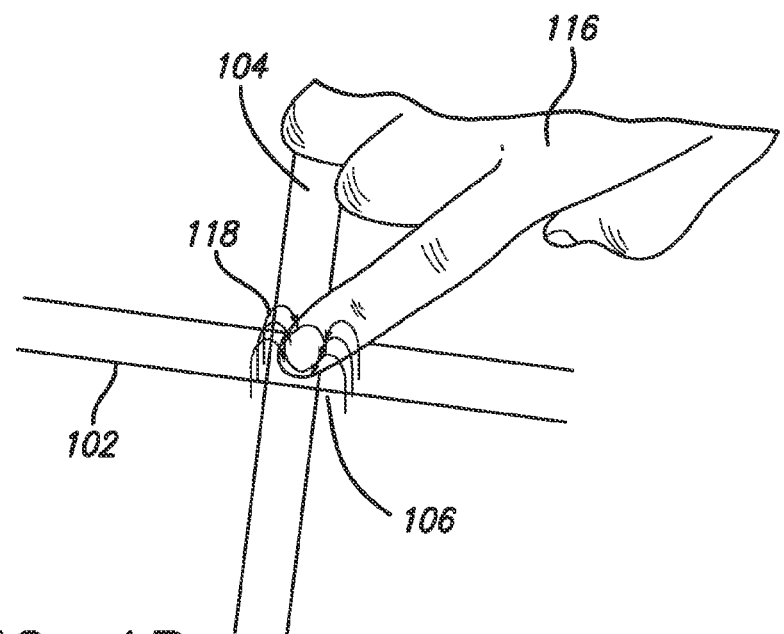
FIG. 1b illustrates an exemplary touch node and the effect that a finger touching the node has on coupled charge according to one disclosed embodiment.

FIG. 1b illustrates an exemplary touch node and the effect that a finger touching the node can have on coupled charge according to one disclosed embodiment. When drive line 102 is stimulated by a signal, electric field lines 118 can form between drive line 102 and sense line 104 due to the mutual capacitance between the drive and sense line, and charge can be coupled from the drive line to the sense line. When a finger or conductive object 116 comes into contact or near proximity to the touch node 106 created by the intersection of drive line 102 and sense line 104, the object can block some of the electric field lines and the amount of charge coupled between the drive and sense line can decrease, with some of the charge being coupled into the finger or object. This decrease in charge coupled onto sense line 104 from drive line 102 can be detected by sense circuitry 110.

Figure 1C:
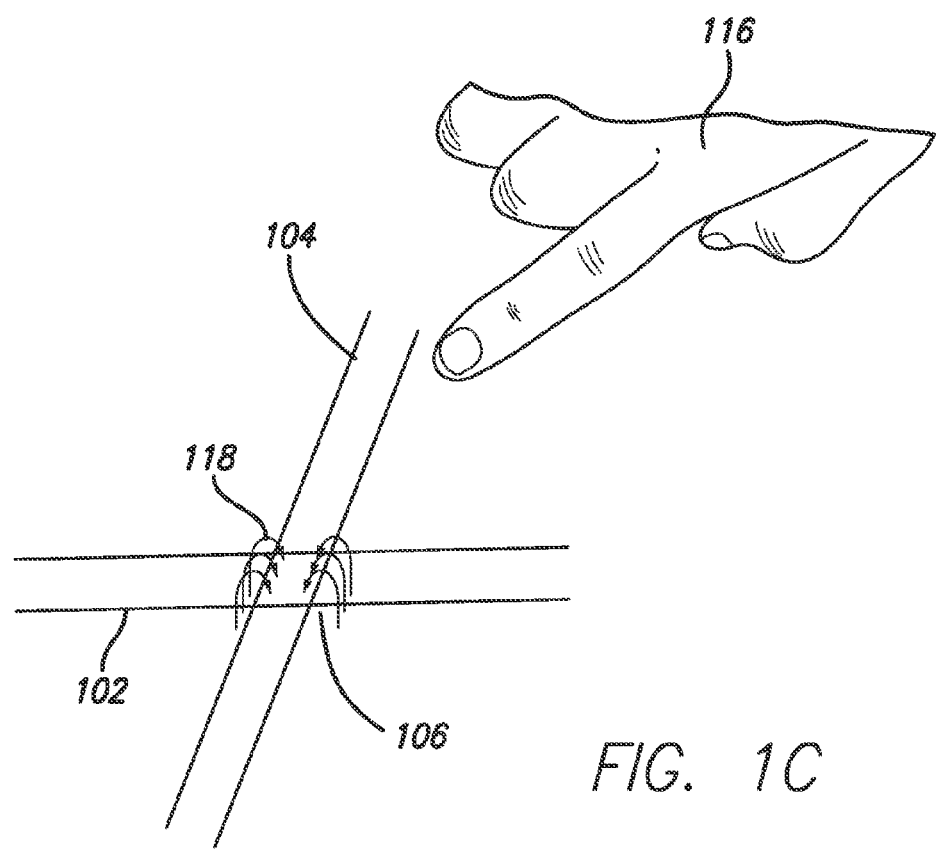
FIG. 1c illustrates another exemplary touch node and the effect that the absence of a finger has on coupled charge according to one disclosed embodiment.

FIG. 1c illustrates an exemplary touch node and the effect that the absence of a finger can have on coupled charge according to one disclosed embodiment. When finger 116 is removed from touch node 106, the charge emanating from drive line 102 is no longer partially coupled into finger 116 and thus the amount of charge coupled into sense line 102 can increase. Finger 116 generally can only couple charge from the drive line 102 if it is touching or in near proximity to touch node 106 and blocking some electric field lines 118. Once the finger 116 is moved away from touch node 106 and is a certain distance away from the node, then the charge is no longer coupled onto finger 116 and the touch sensor panel can no longer detect the presence of the finger and will not register a touch or proximity event. Thus, capacitive touch sensor panels which employ mutual capacitance to detect touch or proximity events often have a very limited range of distance over which the system can detect proximity events.

Figure 2:
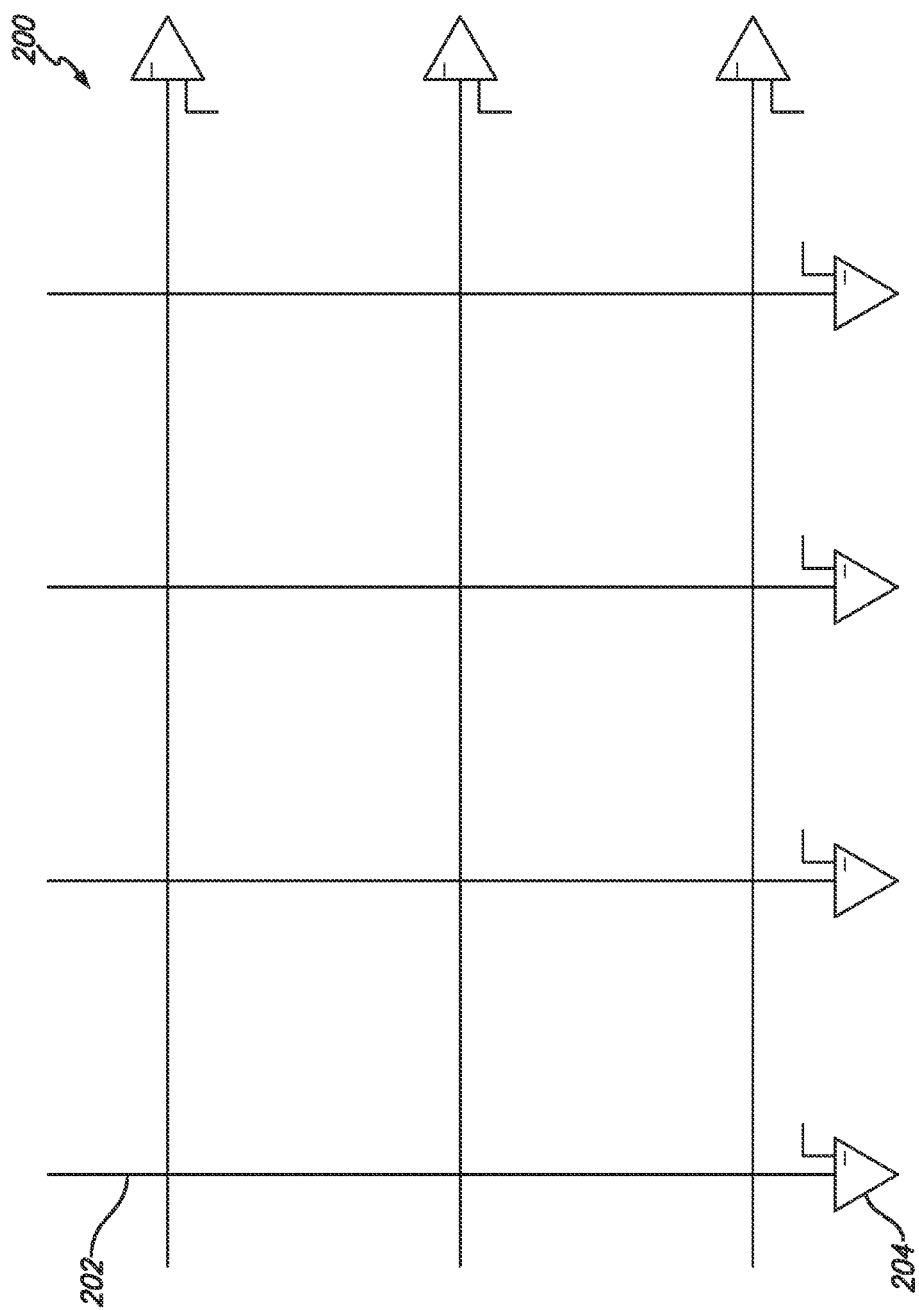
FIG. 2 illustrates an exemplary self-capacitance touch sensor circuit according to one disclosed embodiment.

Touch sensor panels that employ self-capacitance to detect touch or proximity events can be used to detect the presence of a finger or object that is further away from the touch sensor panel than a panel which uses mutual capacitance. FIG. 2 illustrates an exemplary self-capacitance touch sensor circuit 200 according to one disclosed embodiment. Self-capacitive touch sensor panel circuit 200 contains electrodes 202 which are connected to sense circuitry 204 and have a self-capacitance to ground. When an object touches or is in close proximity with the electrode, an additional capacitance can be formed between the electrode and ground through the object, which can increase the self-capacitance of the electrode. This change in the self-capacitance of an electrode 202 can be detected by sensing circuit 204. Changes in self-capacitance can be created when objects or fingers are further away from the touch panel, as opposed to mutual capacitance touch panels which require the finger or object to be either touching or in near proximity to panel in order to sense a touch or proximity event. Unlike mutual capacitance touch sensor 100, each electrode of the circuit acts as a touch node, rather than the intersections of orthogonal electrodes. Thus in 20×15 electrode array, there are only 35 touch nodes. One skilled in the art will recognize that such a self-capacitance architecture can possess a touch resolution that is less than the mutual capacitance touch resolution (e.g., 35 nodes vs. 300 nodes). Since the self-capacitive architecture described above has a reduced spatial resolution when compared to a mutual capacitive touch sensor, a self-capacitive touch sensor panel may not be able to detect touch or proximity event location with as much accuracy or unambiguity as a mutual capacitive touch sensor panel.

Figure 3A:
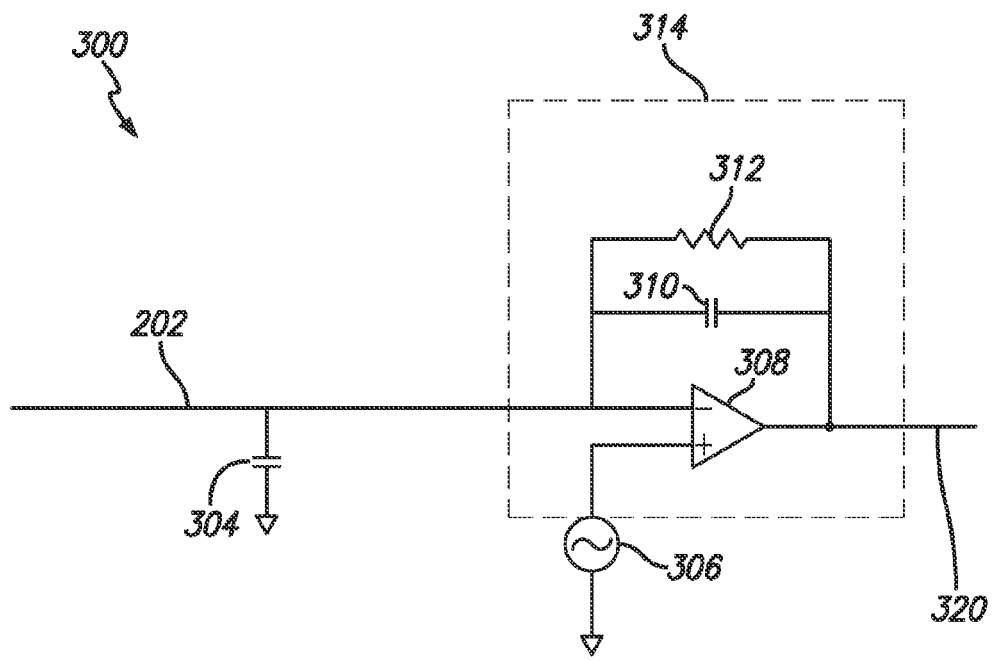
FIG. 3a illustrates an exemplary electrical circuit corresponding to a self-capacitance touch sensor electrode according to one disclosed embodiment.

FIG. 3a illustrates an exemplary electrical circuit corresponding to a self-capacitance touch sensor electrode and sensing circuit according to one disclosed embodiment. Electrode 202 can have a self-capacitance 304 to ground associated with it. Touch electrode 202 can be coupled to sensing circuit 314. Sensing circuit can include an operational amplifier 308, feedback resistor 312, feedback capacitor 310 and an input voltage source 306, although other configurations can be employed. For example, feedback resistor 312 can be replaced by a switched capacitor resistor in order to minimize any parasitic capacitance effect caused by a variable feedback resistor. The touch electrode can be coupled to the inverting input of operation amplifier 308. An AC voltage source 306 (Vac) can be coupled to the non-inverting input of operation amplifier 308. The touch sensor circuit 300 can be configured to sense changes in self-capacitance 304 induced by a finger or object either touching or in proximity to the touch sensor panel. The output 320 of the touch sense circuit 300 is used to determine the presence of a proximity event. The output 320 can either be used by a processor to determine the presence of a proximity or touch event, or output 320 can be inputted into a discrete logic network to determine the presence of a touch or proximity event.

Figure 3B:
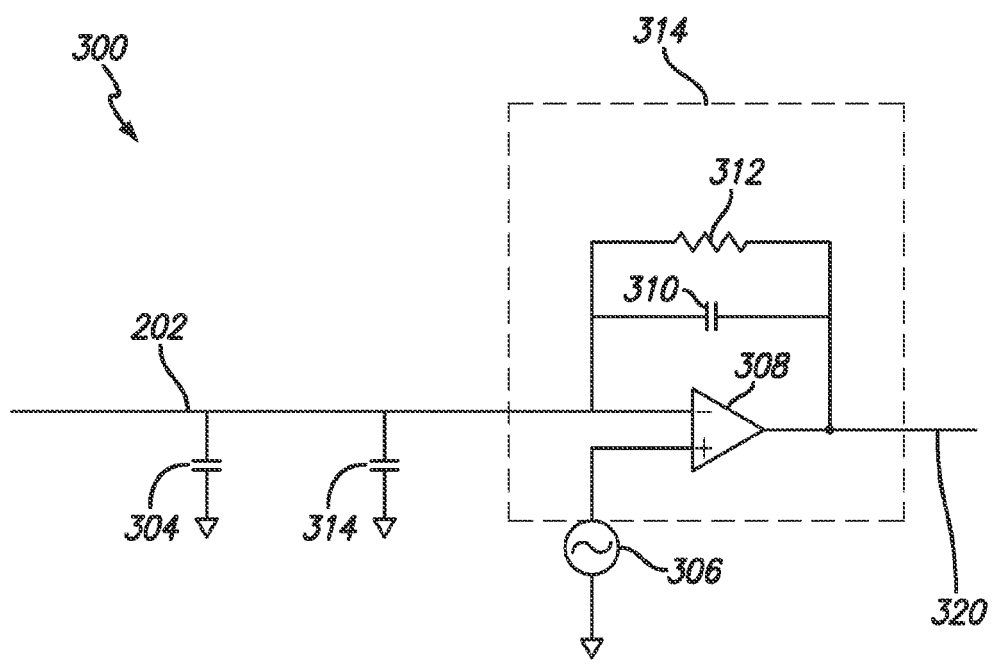
FIG. 3b illustrates an exemplary electrical circuit corresponding to a self-capacitance touch sensor electrode when a parasitic capacitance is present on the touch electrode according to one disclosed embodiment.

FIG. 3b illustrates an exemplary electrical circuit corresponding to a self-capacitance touch sensor electrode and sensing circuit when a parasitic capacitance is present on the touch electrode according to one disclosed embodiment. Parasitic capacitance 314 can represent capacitances found on touch electrode 202 that can be derived from various sources on a device which employs a touch sensor panel. As an example, parasitic capacitance can be created by the interaction between the touch electrodes 202 and other circuitry of the device such as a display or other conductive plates that can exist within a device which employs a touch sensor panel. One of ordinary skill in the art will recognize that in a self-capacitance touch sensing system, parasitic capacitance 314 (Cpar) will be in parallel to the self-capacitance 304 as shown in FIG. 3b. When two capacitors are in parallel they add together, thus the change in capacitance being measured by sense circuit 314 can be Cself+Cpar, where Cself represents the signal of interest which is the self-capacitance of electrode 202. Since sense circuit 314 detects a combination of self-capacitance 304 and parasitic capacitance 314, the relationship between self-capacitance 304 and parasitic capacitance 314 can be important.

For instance, one skilled in the art will recognize that the equation for output 320 (Vout) of sense circuit 300 can be represented as:

$$V_{OUT}=V_{AC}*[(1+C_c \times F/GJ)+(C_e \times H/G)]$$

Figure 4A:
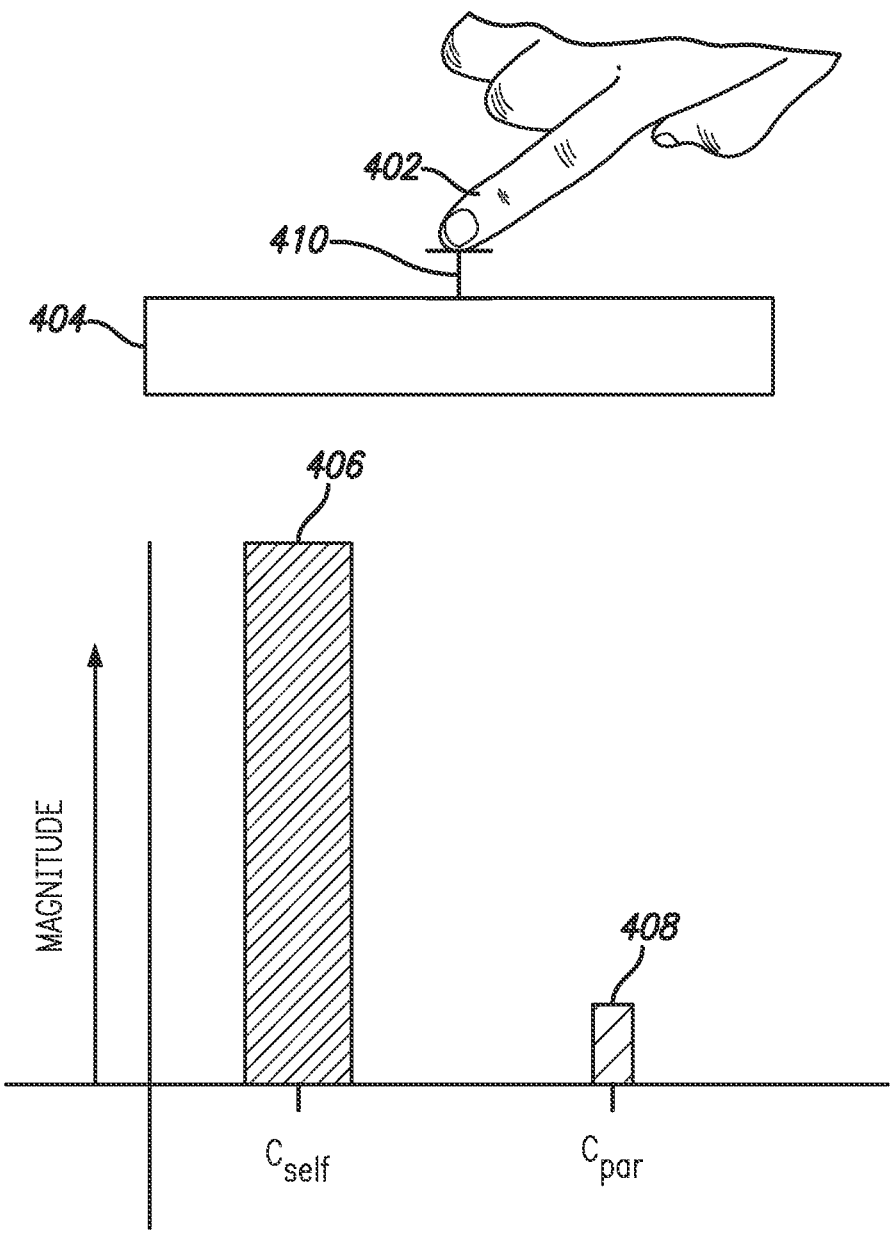
FIG. 4a illustrates an exemplary relationship between Cself and parasitic capacitance when a hand or object is near the self-capacitance touch sensor panel according to one disclosed embodiment.

Where
$F=C_{sb}*(\omega*R_{sb})^2$
$G=1+(\omega*R_{jb}*C_{sb})^2$
$H=\omega*R_{sb}$
$C_e=Cself+C_{par}$ As expressed in the equation above, the phase of output 320 is dependent upon the value of Cself and Cpar. Thus, Cpar produces a phase offset and can hinder sense circuitry 204's ability to detect proximity events. In the equations above, ω can be defined as the frequency of the stimulation signal applied to the electrodes via the non-inverting input of operational amplifier 308 represented in the equations above as Vac. If Vac is a sinusoidal signal then the equation above can be simplified such that:

If $V_{AC}=\mathrm{Sin}(\omega t)$ then $V_{AC}=\mathrm{Sin}(\omega t+\beta+\phi)$ φ=phase shift caused by $C_{par}$
β=phase shift caused by Cself Also, the magnitude of parasitic capacitance 314 in relation to the magnitude of self-capacitance 304 can have an effect on how accurately sense circuit 314 is able to detect changes in self-capacitance created by a finger or object in proximity to touch electrode 202. FIG. 4a illustrates an exemplary relationship between Cself and parasitic capacitance when a hand or object is near the self-capacitance touch sensor panel. As illustrated, when hand 402 is a short distance 410 from touch panel 404, the magnitude of Cself (self-capacitance) 406 is larger than the magnitude of Cpar (parasitic capacitance) 408. Note that the magnitudes are illustrative and shown for purposes of relative comparison only, and are not intended to represent actual magnitudes. If Cself 406 is considered the signal of interest and Cpar 408 is considered a noise source, then the touch sensor panel 404 can be said to have a good signal to noise ratio (SNR), thus making touch and proximity detection more reliable.

Figure 4B:
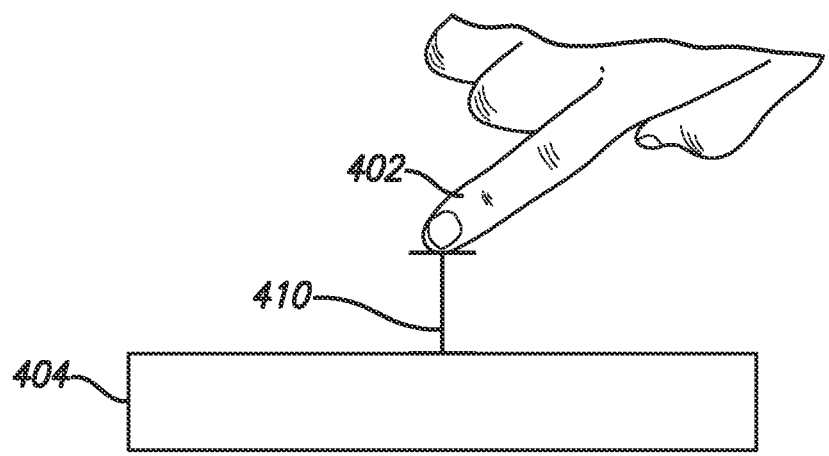
FIG. 4b illustrates an exemplary relationship between Cself and parasitic capacitance when a hand or object is far from the self-capacitance touch sensor panel.
Figure 4B:
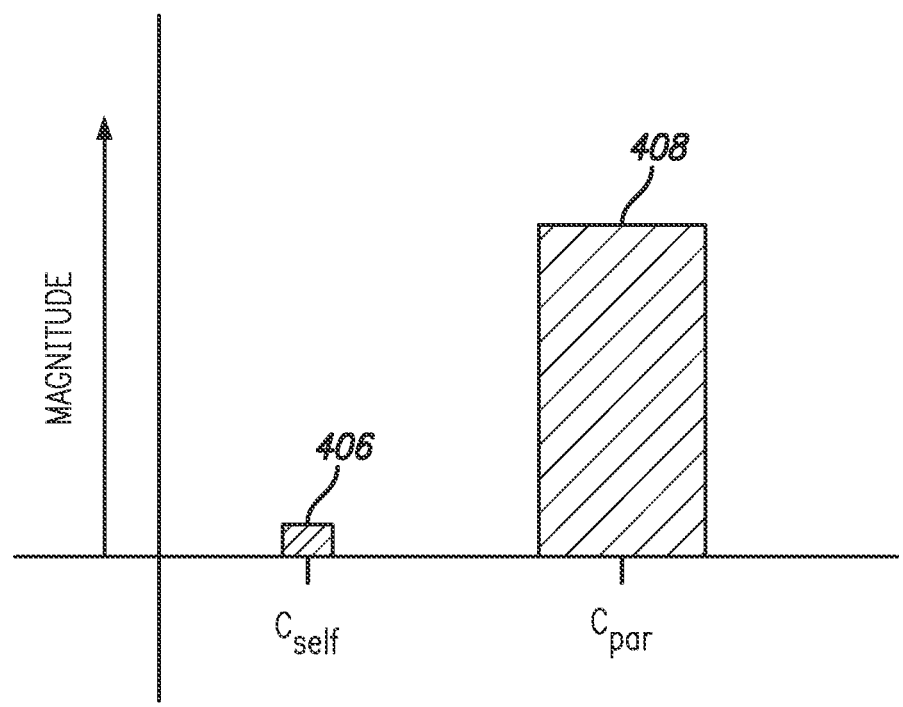

FIG. 4b illustrates an exemplary relationship between Cself and parasitic capacitance when a hand or object is far from the self-capacitance touch sensor panel. When hand 402 increases its distance 410 from touch panel 404, the magnitude of Cself 406 can become much smaller since Cself is inversely proportional to the distance that an object is located from the touch sensor panel. While fluctuations in distance 410 can cause fluctuations in the magnitude of Cself 406, Cpar 408 can remain roughly constant. This means that as the hand 402 moves farther away from touch sensor panel 404, the SNR of the sensor system can decrease. Eventually, when hand 402 is a certain distance 410 from touch sensor panel 404, Cpar 408 can be said to "drown out" Cself 406. In other words, the magnitude of Cpar 408 can be so great as compared to the magnitude of Cself 406 that touch sense circuitry 204 may no longer be able to detect changes in Cself. Furthermore, as the magnitude of Cself becomes smaller, more gain from touch sensing circuit 314 may be required, in order to allow detection of changes in Cself. However, if the magnitude of Cpar 408 is too great, then operation amplifier 308 can become saturated and thus may not be able to provide adequate signal gain to sense changes in Cself.

These relationships between Cself and Cpar can mean that a self-capacitance touch sensor panel's performance over distance can be constrained by at least two factors: the distance 410 that a hand or object 402 is away from touch panel 404, and the amount of parasitic capacitance 408 present on the touch sensor panel 404. In order to achieve an acceptable SNR across a wide dynamic range of distance, parasitic capacitance 408 can be reduced or eliminated so that its magnitude relative to Cself is small, and its energy does not saturate amplifier 308 and reduce the amplifier's ability to provide adequate gain to measure Cself.

Figure 5:
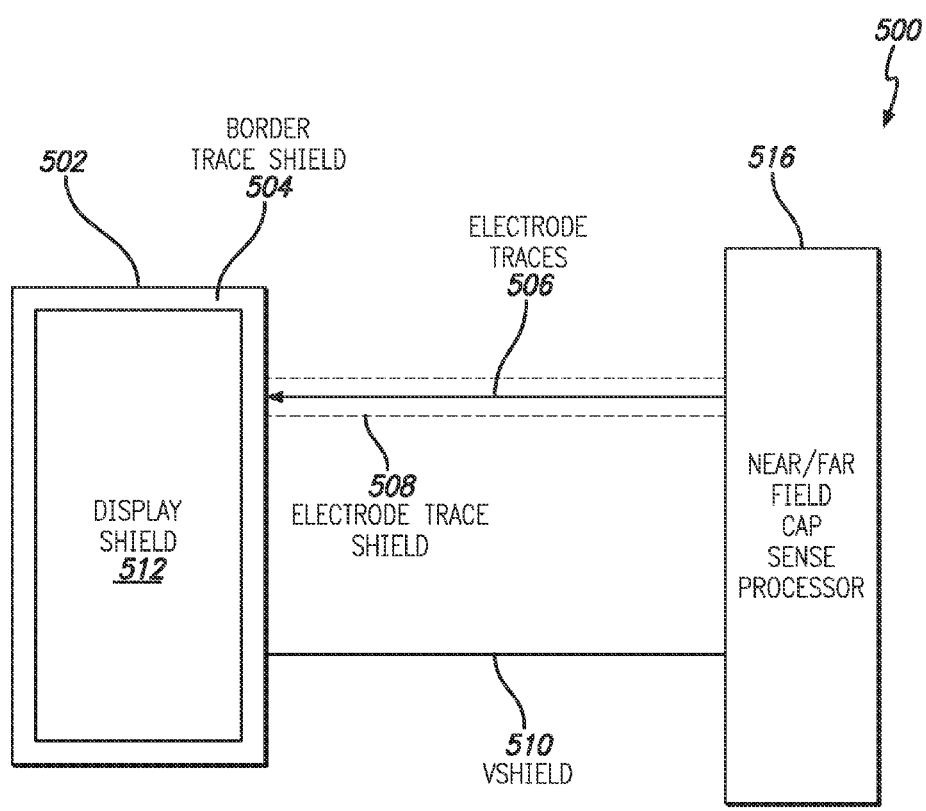
FIG. 5 illustrates an exemplary touch sensor system employing driven shielding according to one disclosed embodiment.

Thus, in order to increase the dynamic range within which proximity events can be detected, the effect that parasitic capacitance has on touch and proximity event detection can be mitigated in order to allow for errors in proximity event detection to be minimized. According to one embodiment, mitigating parasitic capacitance can involve attenuating the magnitude of Cpar so that its magnitude in relation to the magnitude Cself is small. Driven shielding can be used to attenuate parasitic capacitance. FIG. 5 illustrates an exemplary touch sensor system employing driven shielding according to one disclosed embodiment. Driven shielding touch sensor system 500 can include touch controller 516 which can drive the touch sensor panel 502 with stimulation signals via electrode traces 506, and process touch signals outputted by touch input device 502. Touch sensor panel 502 may contain a display and a border trace area which can be encapsulated or otherwise protected by a conductive display shield 512 for the display and conductive border trace shield 504 for the border trace area (e.g., one or more shield layers in the display and/or border trace stackus). Border trace shield 504 and display shield 512 can conduct a signal Vshield 510 generated by touch controller 516. Electrode traces 506 can also have a shield 508 encapsulating them (e.g., one or more shield layers in a flex circuit stackup). Vshield 510 can drive electrode trace shield 508 and display shield 512.

Figure 6A:
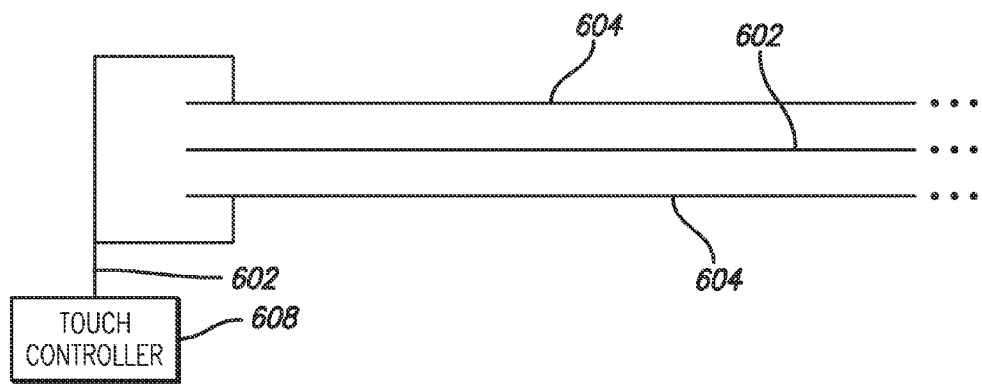
FIG. 6a illustrates an exemplary driven shielding circuit diagram of a touch electrode according to one disclosed embodiment.

FIG. 6a illustrates an exemplary shielding circuit diagram of a touch electrode layer in a flex circuit according to one disclosed embodiment. In a touch or near-field proximity sensing configuration, touch controller 608 can output a stimulation signal onto row electrode traces on layer 602. Touch electrode layer 602 can be encapsulated (e.g., covered on top and/or bottom) by one or more conductive shields 604. Conductive shields 604 can be connected to Vshield 610, which can provide a DC reference voltage (in touch or near-field proximity sensing embodiments) or an AC signal (in far-field proximity sensing embodiments) to the conductive shield 604. In far-field proximity sensing embodiments, Vshield 610 can be configured to carry either the same or a similar signal to the signal being carried on electrode 602. If the signals on the shield 604 and the electrode 602 are about the same, then parasitic capacitive effects caused by the electrodes can be attenuated or even eliminated since the effective capacitance between two conductive plates at the same voltage is zero. By encapsulating the electrode 602 within conductive sheath 604, and then driving conductive sheath 604 with a Vshield 510 which carries an identical or nearly identical signal as the signal being transmitted on the electrode, the change in voltage between the conductive plate of the electrode and the conductive plate of the shield can be zero or nearly zero, meaning parasitic capacitances contributed by the electrode's interaction with other conductive plates in the system can be attenuated.

In some embodiments such as far-field proximity sensing which utilize self-capacitive touch detection as described above, and as illustrated in the circuit diagram of FIG. 3b, touch electrode 202 can receive signal Vac 306 during touch detection. Thus, if electrode 202 is shielded with a conductive shield 604, and Vshield 602 is set to equal Vac 306, then the driven shield can attenuate the portion of the total parasitic capacitance caused by the electrode's 202 interaction with other conductive plates.

Figure 6B:
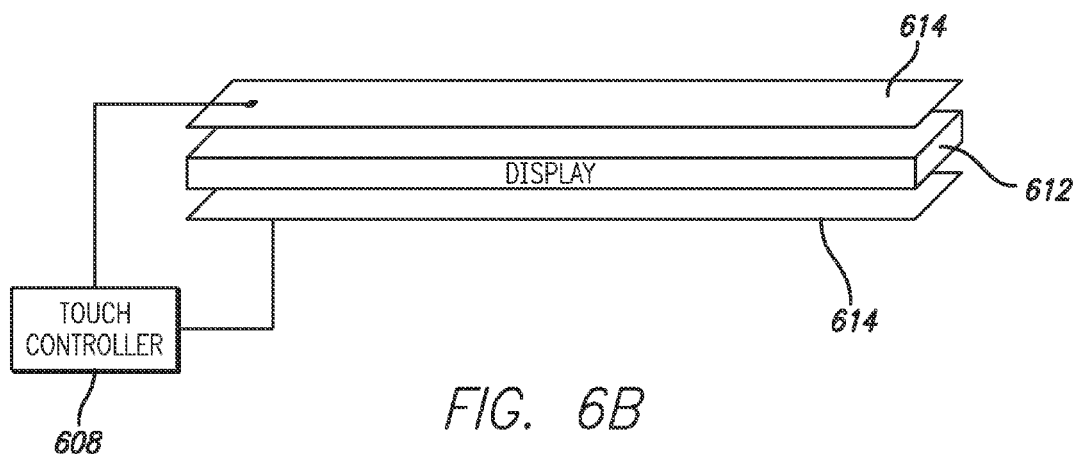
FIG. 6b illustrates an exemplary driven shielding circuit diagram of a display according to one disclosed embodiment.

FIG. 6b illustrates an exemplary driven shielding circuit diagram of a display according to one disclosed embodiment. Touch controller 608 can output a signal Vshield 510 that drives display shield 614, which can encapsulate (e.g., cover on top and/or bottom) display 612. Similar to the description given for the touch electrode 902 of FIG. 9a, in far-field proximity sensing the display shield 614 can be driven with a signal that is similar or identical to the signal being carried on the electrodes, in order to attenuate parasitic capacitance.

Figure 6C:
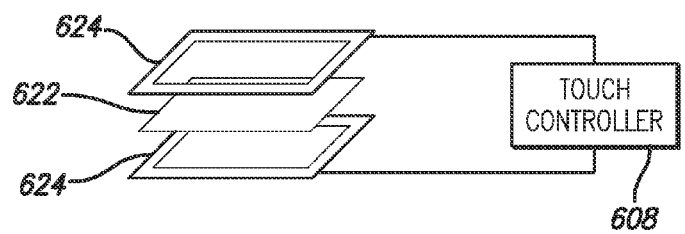
FIG. 6c illustrates an exemplary driven shielding circuit diagram of a border trace region according to one disclosed embodiment.

FIG. 6c illustrates an exemplary driven shielding circuit diagram of a border trace region according to one disclosed embodiment. Touch controller 608 can output a signal Vshield 510 that drives border trace shield 624, which can encapsulate (e.g., cover on top and/or bottom) border trace region 622. Similar to the description given for the touch electrode 602 of FIG. 6a, and display 612 of FIG. 6b, in far-field proximity sensing the border trace shield 624 can be driven with a signal that is similar or identical to the signal being carried on the electrodes in order to attenuate parasitic capacitance.

While the driven shielding method above can attenuate substantially all of the parasitic capacitance of the touch sensor panel, some residual parasitic capacitance may remain, thus it may be necessary to employ a second method to mitigate parasitic capacitance. According to another embodiment, mitigating parasitic capacitance can also involve offsetting the phase shift associated with parasitic capacitance, so that the parasitic capacitance's contribution to phase noise can be reduced or eliminated.

Figure 7:
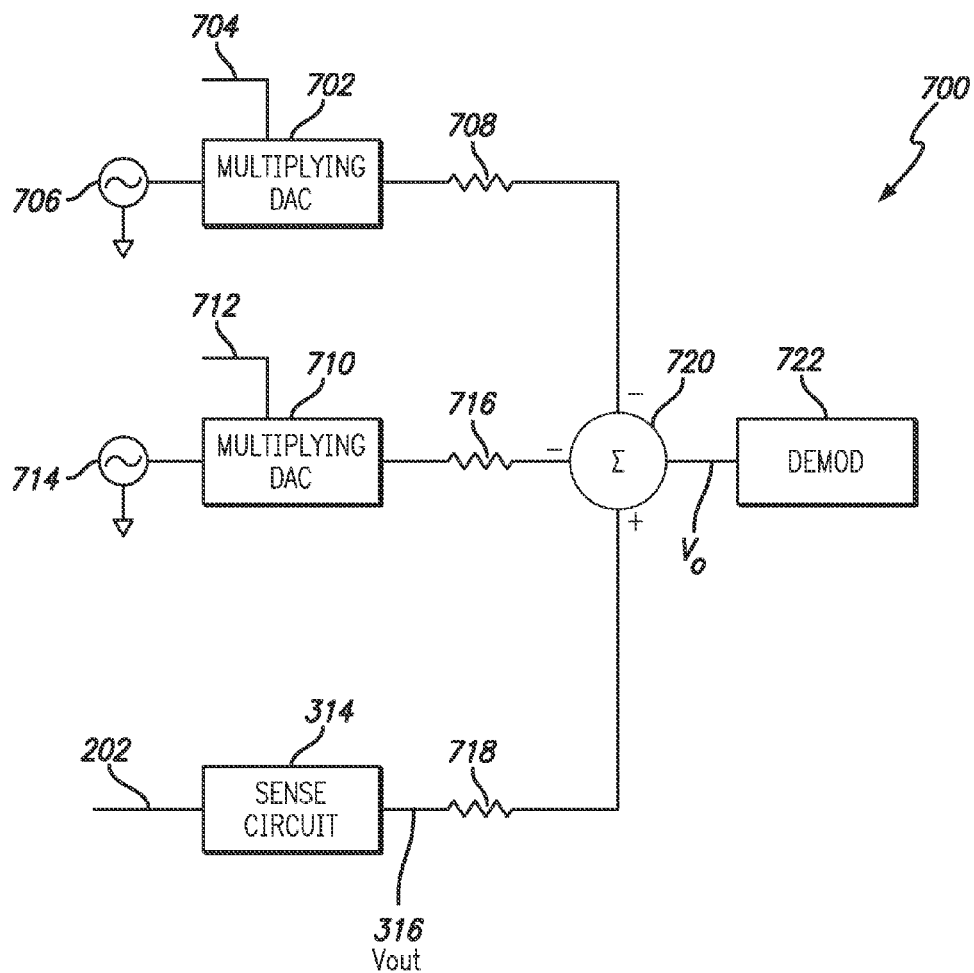
FIG. 7 illustrates an exemplary wide dynamic range self-capacitive touch sense circuit with voltage based offset according to one disclosed embodiment.

FIG. 7 illustrates an exemplary wide dynamic range self-capacitive touch sense circuit with voltage based offset according to one disclosed embodiment. The voltage based offset circuit 700 can be used to offset phase offset caused by parasitic capacitance. Voltage based offset circuit 700 can contain two multiplying digital to analog converters (DAC) 702 and 710. The two multiplying DACs produce signals that, when added to the sensed signal, can reduce or eliminate the phase offset due to parasitic capacitance. The first multiplying DAC 702 receives signal 704 which is a digital value representative of a value between 1 and −1 which can be expressed as $\sin(\Omega)$, and a sinusoidal signal 706 equivalent to $\cos(\omega t)$, which represents a sinusoid with the same frequency as the output of touch sense circuit 316. With those inputs, multiplying DAC 702 can produce an output signal 708 (Vc), which represents the simple product of its two inputs expressed below in equation form.

$$V_C = \cos(\omega t)\sin(\Omega)$$

The second multiplying DAC 710 receives signal 712 which is a digital value representative of a value between 1 and −1 which can be expressed as $\cos(\Omega)$, and a sinusoidal signal 714 equivalent to $\sin(\omega t)$. With those inputs, multiplying DAC 510 can produce an output signal 516 (Vs), which represents the simple product of its two inputs.

$$V_S = \sin(\omega t)\cos(\Omega)$$

The value of $\Omega$ can be determined during a calibration procedure which will be described below.

When no touch is present on the touch panel the change in Cself=0. Ideally when no touch is present, the output of touch sense circuit 314, denoted as Vout 316, should equal to 0. However due to parasitic capacitance, even when a touch signal is not present, Vout 316 can have a value equal to:

$$V\text{out} = \sin(\omega t + \phi)$$

Thus in order to calibrate out effects due to parasitic capacitance, when no touch event is occurring it is desired to have the output of the summing circuit at junction 520=0, since this would be the output if the change in Cself was 0 and no parasitic capacitance was present. When no touch signal is present, the equation which characterizes the output at junction 720 is equal to:

$$V\text{out} - Vc - Vs = \sin(\omega t + \phi) - \cos(\omega t)\sin(\Omega) - \sin(\omega t)\cos(\Omega)$$

Since the goal of calibration is to make the output at junction 720 equal to 0 when no touch signal is present, the equation above becomes Vout−Vs−Vc=0

$$V\text{out} - Vc - Vs = \sin(\omega t + \phi) - \cos(\omega t)\sin(\Omega) - \sin(\omega t)\cos(\Omega) = 0$$

Using standard trigonometric identities Vc+Vs can be simplified as:

$$V_S + V_C = \cos(\omega t)\sin(\Omega) + \sin(\omega t)\cos(\Omega)$$

$$V_S + V_C = \sin(\omega t + \Omega)$$

Using the above simplification, the equation for Vout−Vc−Vs becomes $$\sin(\omega t + \phi) - \sin(\omega t + \Omega) = 0$$

$$\sin(\omega t + \Omega) = \sin(\omega t + \phi)$$

Thus: $\Omega = \phi$

In order to get the output of junction 720 to equal 0 when no touch is present, the multiplying DAC's 704 and 712 can be programmed with a value of $\Omega$ such that $\Omega = \phi$.

Figure 8:
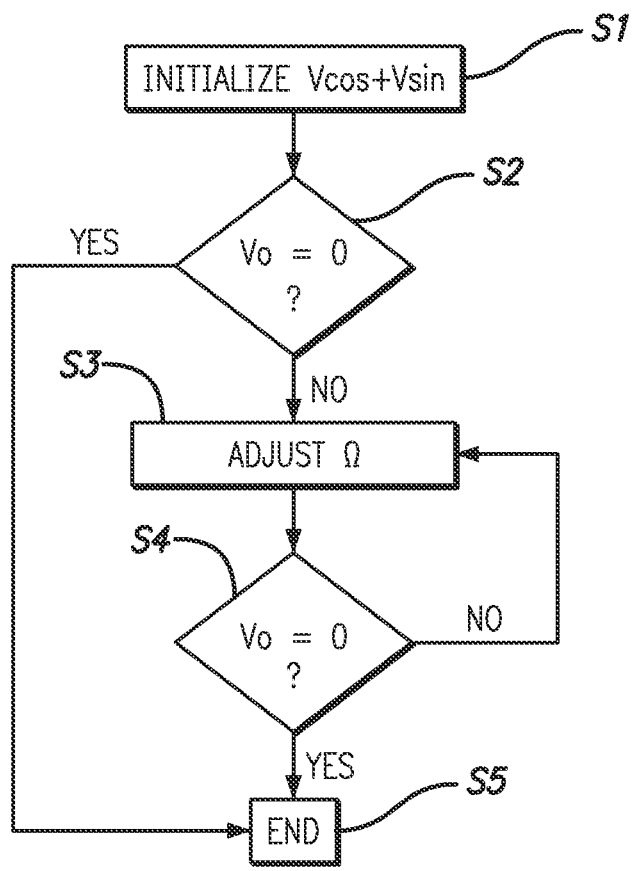
FIG. 8 illustrates a flow diagram illustrating an exemplary procedure to calibrate multiplying digital to analog converters according to one disclosed embodiment.

FIG. 8 illustrates a flow diagram illustrating an exemplary procedure to calibrate multiplying digital to analog converters according to one disclosed embodiment. At step S1, an initial value of $\Omega$ can be set and provided to multiplying DAC's 702 and 710. At step S2, the output of junction 520 can be checked to determine if its value is 0. If it is 0, then the calibration procedure can be terminated. If it is not 0, then the process moves to S3 and $\Omega$ can be adjusted to a new value. At step S4, the output value of junction 520 can be checked to determine if its value is 0. If it is, then the process moves to step S5 where is the process can be terminated. If it is not 0, then the process goes back to S3 and repeats. Eventually, a value of $\Omega$ can be found such that the output of junction 520 is 0. When this is achieved, the effect that parasitic capacitance has on phase can effectively be calibrated out. One skilled in the art will recognize that the procedure detailed in FIG. 8 is just one method of determining the phase offset. In other embodiments the offset can also be computed by measuring the phase offset on the output of an in-phase and quadrature phase demodulation architecture.

Figure 9:
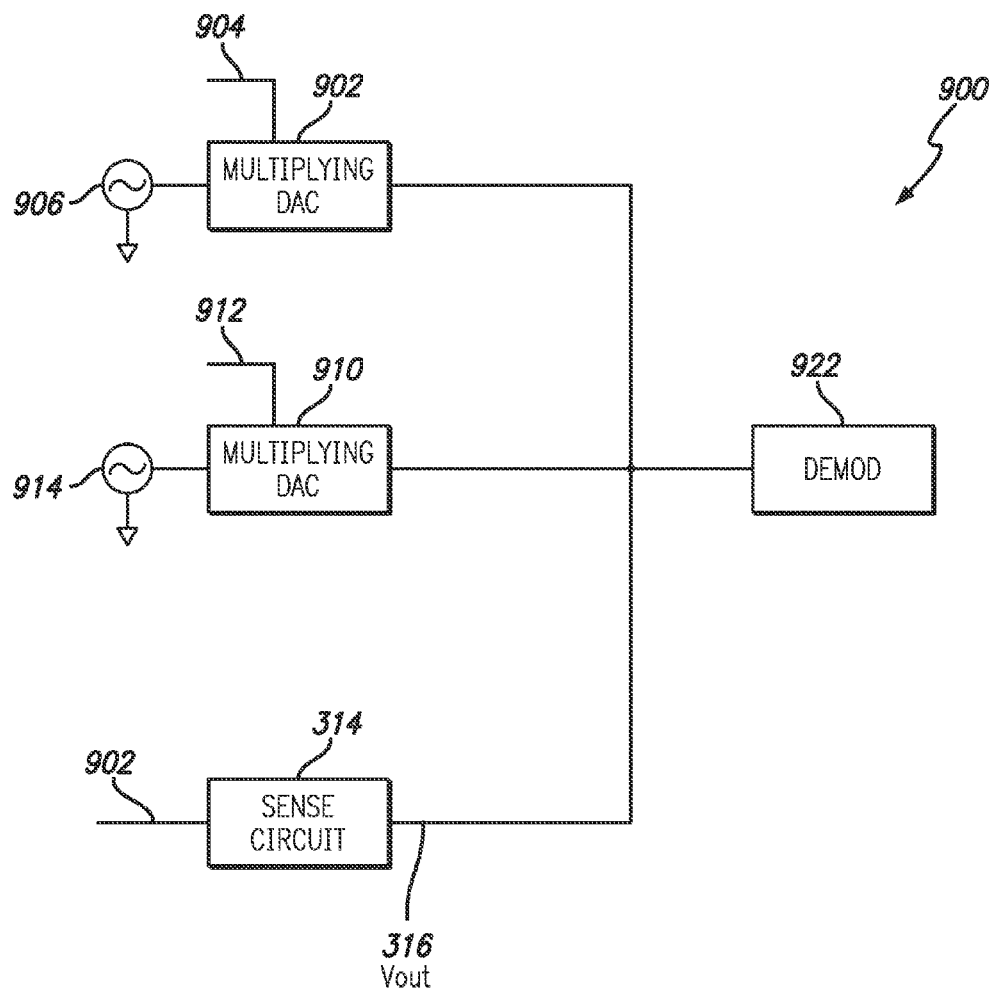
FIG. 9 illustrates an exemplary wide dynamic range self-capacitive touch sense circuit with current based offset according to one disclosed embodiment.

FIG. 9 illustrates an exemplary wide dynamic range self-capacitive touch sense circuit with current based offset according to one disclosed embodiment. A current based offset can act in the same manner as the voltage based offset method described above, the only difference being that resistors 708, 716 and 718 of FIG. 7 are no longer needed to convert the current to voltage, and the voltages do not need to be summed as demonstrated in FIG. 7 at junction 720. As shown in FIG. 9, multiplying DACs 902 and 910 are driven by sinusoidal signals 906 and 914 respectively, and have a digital gain value 904 and 912 as an input. The current produced by each multiplying DAC is combined with the current produced by the sense circuit, and the gains of the multiplying DAC's are adjusted until the combined current is equal to 0 in a manner described above in relation to FIG. 7 and FIG. 8.

Figure 10A:
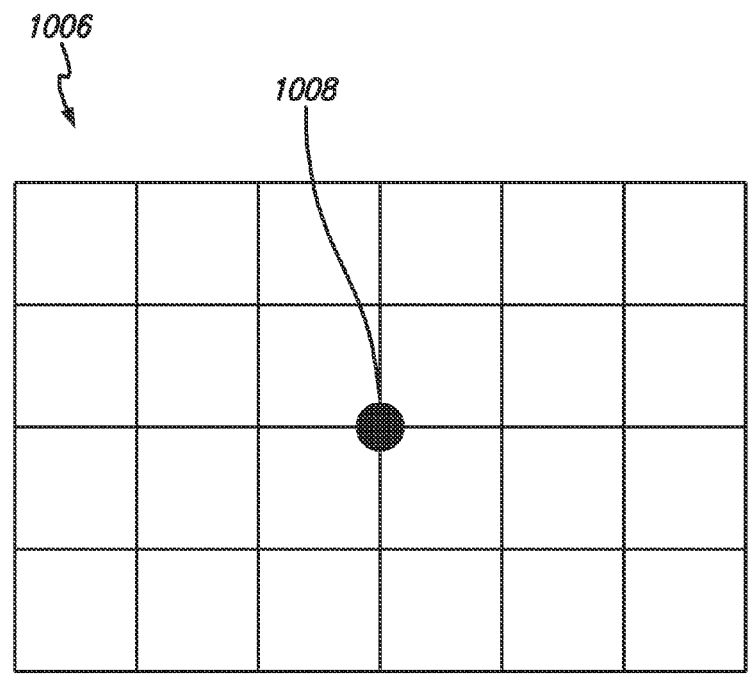
FIG. 10a illustrates an exemplary mutual capacitance touch sensor panel with a touch event occurring, and an exemplary corresponding touch resolution according to one disclosed embodiment.
Figure 10A:
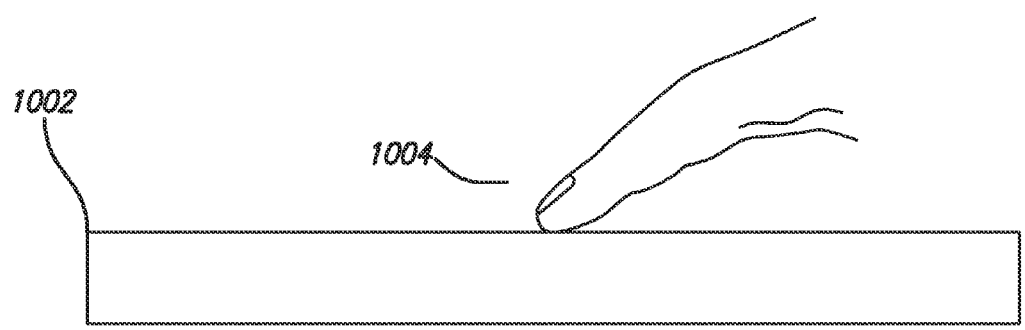

While self-capacitance touch sensor panels that mitigate parasitic capacitance, as described above, can detect proximity events at a greater distance than using a mutual capacitive touch sensor panel, they can often have less resolution than a mutual capacitance touch sensor panel and can, in projection scan configurations, produce ambiguous results. Touch or proximity resolution can mean the degree of accuracy to which the object's location on the touch sensor panel can be determined. FIG. 10a illustrates an exemplary mutual capacitance touch sensor panel with a touch event occurring, and an exemplary corresponding touch resolution. As shown, mutual capacitive touch sensor panel 1002 can receive either a touch event or a near proximity event 1004. When touch event 1004 is occurring, the matrix 1006 composed of intersecting drive electrodes 102 and sense electrodes 104 can register a touch event at touch node 1008.

Figure 10B:
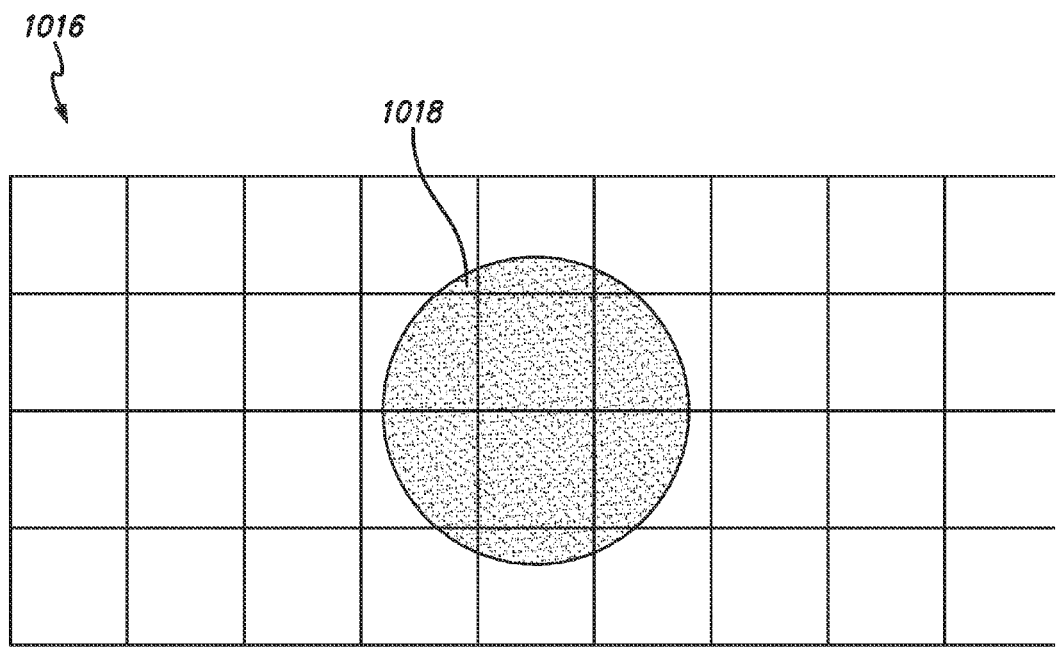
FIG. 10b illustrates an exemplary self-capacitance touch sensor panel with a proximity event occurring, and an exemplary corresponding touch resolution according to one disclosed embodiment.
Figure 10B:
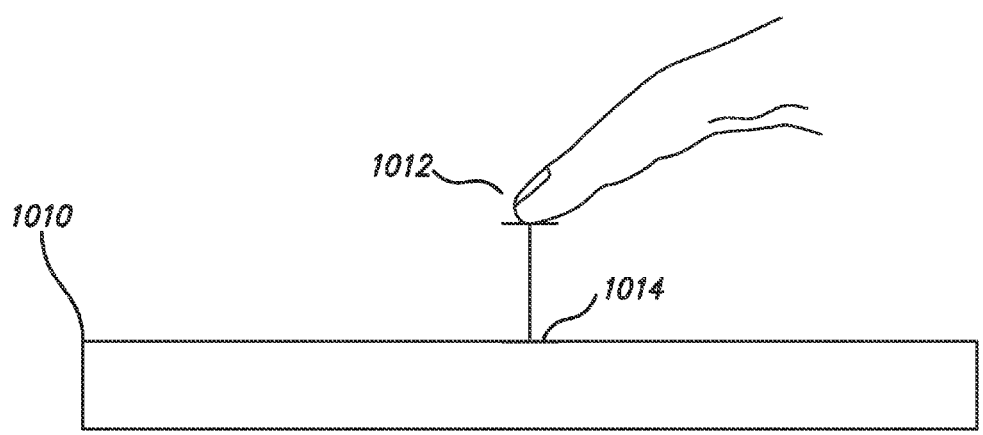

FIG. 10b illustrates an exemplary self-capacitance touch sensor panel with a proximity event occurring, and an exemplary corresponding proximity resolution. As shown, self-capacitance touch sensor panel 1010 can detect proximity events from objects 1012 that are a distance 1014 away from the touch sensor panel. When a proximity event is occurring, the touch matrix 1016 composed of electrodes 202 can register a proximity event occurring over a region 1018. Region 1018 covers a larger area than touch node 1008 and thus the panel 1010 can only sense that a proximity event is occurring within a certain region of the panel, as compared to the mutual capacitance 1002 which can detect touch events to the specific node 1008 where the event is occurring.

However, because only coarse resolution may be required when detecting far-field proximity events, while fine resolution may be required when detecting touch or near-field proximity events, both types of touch sensing can be advantageous at different times (e.g., as an object approaches and eventually touches a touch-sensitive surface) or in different applications (e.g., detecting touch gestures vs. detecting an approaching user to turn on a device). Thus, a device which can detect touch or near proximity events with fine resolution, and detect proximity events further away with coarser resolution, can be beneficial.

According to some embodiments, a device that contains both a mutual capacitance and a self-capacitance touch sensor panel working in parallel can achieve the goal of having a touch sensor panel which can do both mutual capacitance touch sensing and self-capacitance touch sensing simultaneously in one device. According to other embodiments, a touch sensor panel that is able to switch its configuration to a mutual capacitance configuration to detect touch or near field proximity events, and switch its configuration to a self-capacitance configuration to detect far field proximity events can also achieve the goal of having a touch sensor panel which can do both mutual capacitance touch sensing and self-capacitance touch sensing in one device.

Figure 11A:
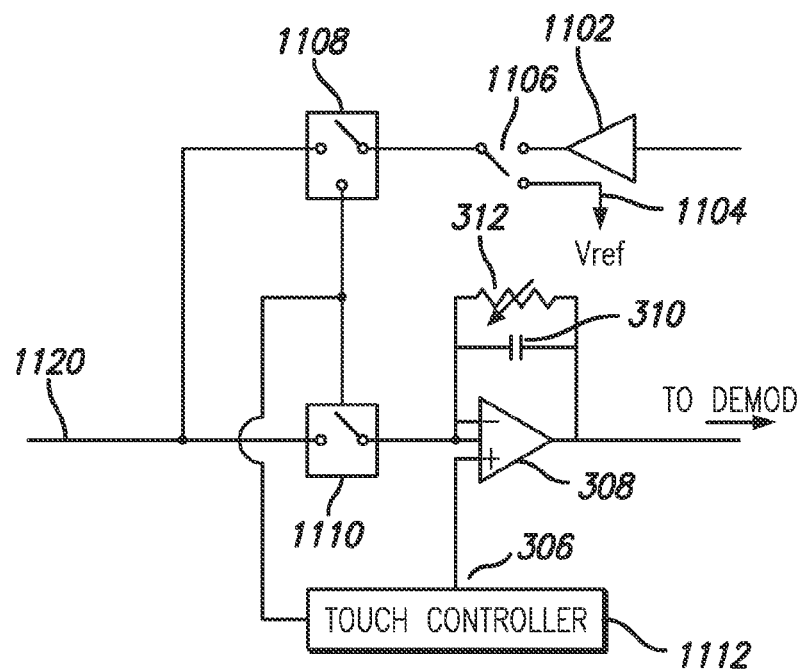
FIG. 11a illustrates an exemplary switching diagram for switching between a mutual capacitance touch sensor drive line configuration and a self-capacitance touch sensor electrode configuration according to one disclosed embodiment.
Figure 11B:
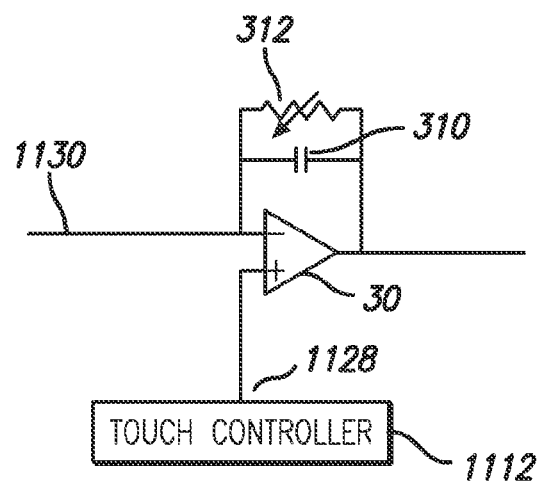
FIG. 11b illustrates an exemplary switching diagram for switching between a mutual capacitance touch sensor sense line configuration and a self-capacitance touch sensor electrode configuration according to one disclosed embodiment.

FIG. 11a-11b illustrates an exemplary switching diagram for switching between a mutual capacitance touch sensor configuration and a self-capacitance touch sensor configuration. Switching can be achieved by changing the configuration of the drive lines of a mutual capacitance touch sensor panel to a self-capacitance touch electrode configuration, and vice versa. FIG. 11a illustrates an exemplary switching diagram for switching between a mutual capacitance touch sensor drive line configuration and a self-capacitance touch sensor electrode configuration according to one disclosed embodiment. Touch controller 1112 can send a signal to switches 1108 and 1110 to either engage a near field mutual capacitance system (which includes touch) or to engage a far field self-capacitance system. Switches 1108 and 1110 form an input/output (I/O) line that can be connected to touch electrode 1120 on the touch sensor panel. If a near field configuration is desired, then touch controller 1112 will close switch 1108 and open switch 1110. With switch 1108 closed, touch electrode 1120 can be either connected to electrode driver 1102, or a reference voltage 1104 (e.g., ground) depending on the position of switch 1106. It should be understood that driver 1102, switch 1106 and reference voltage 1104 are merely symbolic, and that other configurations that achieve the same result are contemplated. When the row corresponding to drive electrode 1120 is being stimulated, then switch 1106 will connect to electrode driver 1102. When the row is not being stimulated then switch 1106 will be switched to reference voltage 1104. Note that in some embodiments, all of the circuitry in FIG. 11A can reside in the touch controller 1112.

If a far field configuration is desired, then touch controller 1112 can open switch 1108 and close switch 1110. When switch 1110 is closed, electrode 1120 is connected to operational amplifier 308. Operational amplifier can be configured as a noninverting amplifier in the self-capacitance sensing configuration illustrated in FIG. 3a with feedback resistor 312 and feedback capacitor 310 connected between its output and its inverting input, and Vshield 306 outputted by touch controller 1112 to its non-inverting input. Drive electrode 1102 and ground 1104 are no longer connected to electrode 1120.

In some embodiments, the exemplary circuitry of FIG. 11A can be replicated for every touch electrode 1120. In other embodiments, the drivers 1102 and/or amplifiers 308 can be multiplexed so that fewer drivers and/or amplifiers can be utilized as compared to the number of electrodes. In some embodiments, feedback resistor 312 and feedback capacitor 310 can be switched to include other capacitors and resistors, depending on the value required for super far field and far field sensing. Thus, while one set of resistor and capacitor values can be used for super far field sensing, when electrode 1120 is switched to far field sensing, feedback resistor 312 can be reconfigured to a different resistance, and feedback capacitor 310 can be reconfigured to a different capacitance.

FIG. 11b illustrates an exemplary switching diagram for switching between a mutual capacitance touch sensor sense line configuration and a self-capacitance touch sensor electrode configuration according to one disclosed embodiment. Operational amplifier 308 can be configured similar to FIG. 3a and is described above. When touch sense electrode 1130 is configured for near field sensing, touch controller 1112 can output a DC signal to the non-inverting input of operational amplifier 308. When touch sense electrode 1130 is configured for far field sensing, touch controller 1112 can output a signal Vshield to the non-inverting input of operational amplifier 308. Furthermore, feedback resistor 312 and feedback capacitor 310 can be switched to different values, depending on the requirements of configuration. It should be noted that the circuits of FIGS. 11a and 11b are merely exemplary, and that other components and configurations that perform a similar function can also be used.

As illustrated in FIGS. 4a and 4b, as an object 402 such as a hand or stylus moves further away from the self capacitance touch sensor panel 404, the value of Cself becomes smaller and is inversely proportional to the distance 410 that the object is away from touch sensor panel. The gain provided to Cself in each detection mode can be set to optimize the ability to detect the expected signal. For example, the super far field gain can be set to the highest possible value in order to detect the most distant objects. However despite optimizing the gain, eventually, when the object 402 is far enough away from touch sensor panel 404, the value of Cself can become so small that a proximity event can no longer be distinguished from random variations in self capacitance due to various noise sources in the touch sensor panel. In other words, the rise in Cself caused by a proximity event cannot be distinguished from a rise in Cself caused by random system noise. However, if a proximity event is occurring in the super far field (a distance in which a proximity event signal on a single electrode cannot be distinguished from noise) then if the value of Cself on a plurality or all of the electrodes on touch sensor panel 404 is averaged, then a rise in the average Cself of the entire panel can indicate that a super far field proximity event is occurring.

Figure 12:
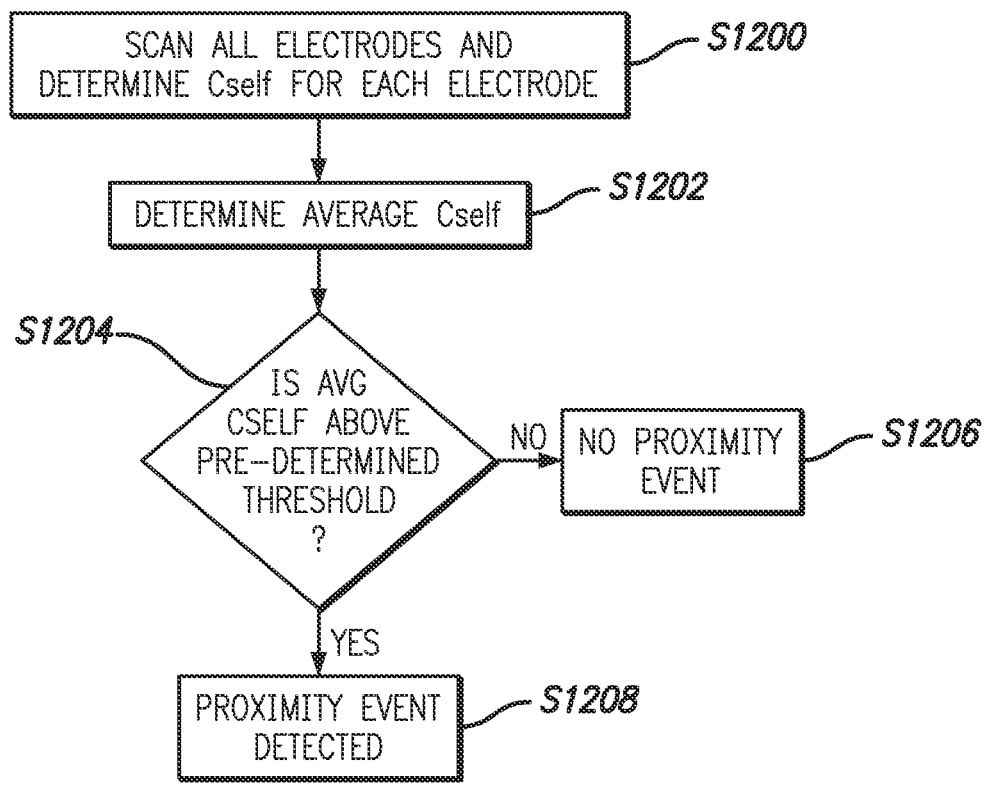
FIG. 12 illustrates a flow diagram illustrating an exemplary procedure to determine if a super far field proximity event is occurring on the touch sensor panel, according to one disclosed embodiment.

FIG. 12 illustrates an exemplary flow diagram illustrating the procedure to determine if a super far field proximity event is occurring on the touch sensor panel, according to one disclosed embodiment. With the touch sensor panel is in a self-capacitance configuration, at step S1200 each or at least a plurality of electrodes in the touch sensor panel are scanned (measured) and Cself for each scanned electrode is determined. At step S1202 each measured value of Cself is used to determine an average Cself. The average Cself represents the average self capacitance that each electrode is experiencing during the scan at S1200. At step S1204 the average Cself calculated in step S1202 is compared against a pre-determined threshold value. If the average Cself is above the threshold, then the flow moves to step 1208 in which the touch controller processor 810 indicates that a proximity event is occurring. If the average Cself is below a pre-determined threshold, then the flow moves to step S1206 and touch controller 810 indicates no proximity event is occurring. Although averaging of Cself is described above, in other embodiments super far field proximity events can be detected by combining multiple Cself values in other ways.

Figure 13:
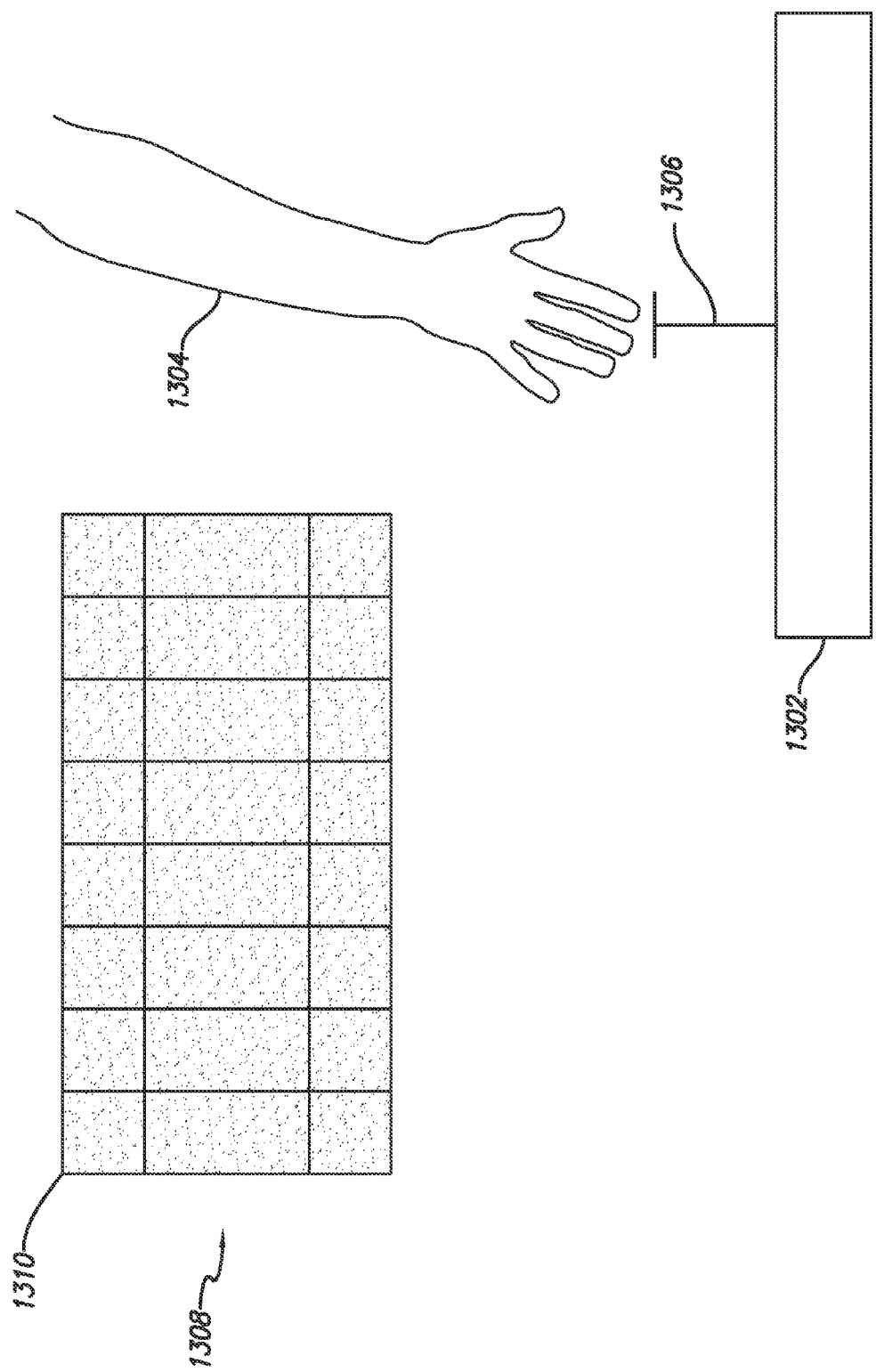
FIG. 13 illustrates an exemplary self-capacitance touch sensor panel in super far field detection mode with a super far field proximity event occurring, and an exemplary corresponding touch resolution according to one disclosed embodiment.

FIG. 13 illustrates an exemplary self-capacitance touch sensor panel in super far field detection mode with a super far field proximity event occurring, and an exemplary corresponding touch resolution according to one disclosed embodiment. When touch sensor panel 1302 is in a super far field sensing mode, an object 1304 a distance 1306 away from the touch sensor panel can register a proximity event. Touch sensor electrode matrix 1308 composed of electrodes 202 can register a proximity event occurring over a region 1310. Since the average Cself of the multiple electrodes in the panel can be used to determine if a proximity event is occurring, the touch resolution of the panel can be poor. As shown, region 1310 covers the entire panel and thus, while the touch sensor panel 1302 is registering a proximity event, the precise location is unknown. The touch sensor panel only registers that a proximity event is occurring, but does not know where the event is occurring. In other embodiments, region 1310 may not cover the entire panel, but a significant portion of the panel.

As described above, the touch sensor panel can have three modes of operation available to operate in. The first mode, near field mutual capacitive touch sensing, can be utilized to detect touch or near proximity events with a high degree of spatial resolution. The second mode, far field self-capacitive touch sensing, can be utilized to detect proximity events that are farther away from the touch sensor panel with a lower spatial resolution. Finally the third mode, super far field capacitive touch sensing, can be utilized to detect proximity events that are even farther away from the touch panel than far field detection but with little to no spatial resolution.

Figure 14:
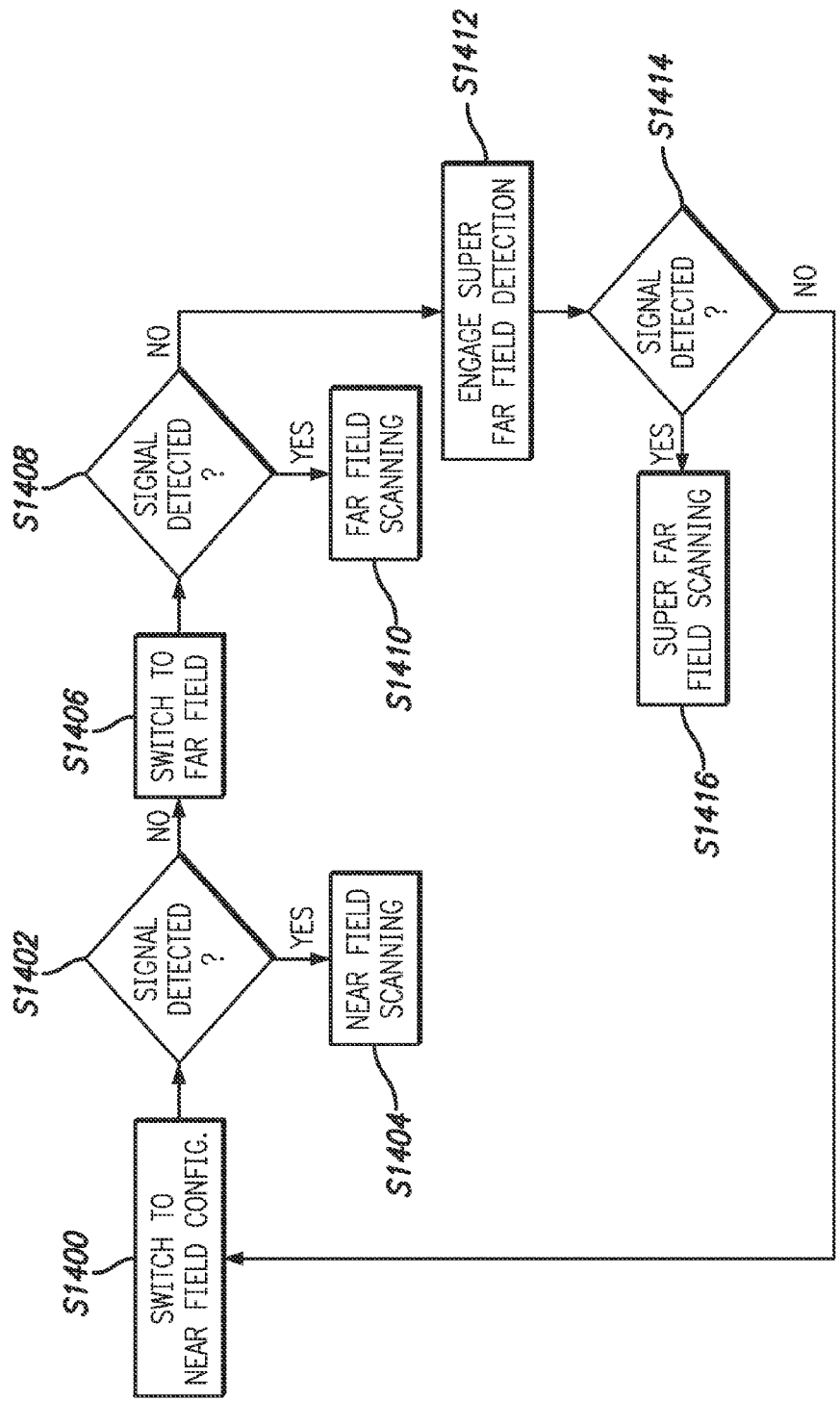
FIG. 14 illustrates a flow diagram illustrating an exemplary procedure for switching touch sensing modes during operation of the touch sensor panel according to one disclosed embodiment.

A device that includes a touch sensor panel capable of detecting signals in two or three of the modes described above, can determine which mode to operate in at any given time by a plurality of methods. FIG. 14 illustrates a flow diagram illustrating an exemplary procedure for switching touch sensing modes during operation of the touch sensor panel according to one disclosed embodiment. At step S1400 the touch sensor panel can be switched to a near field configuration as described above. If the touch sensor panel is already in the near field configuration, then no switching is necessary. At step S1402, the touch sensor panel can be scanned to determine if a signal is present. If a signal is found, then the flow moves to step S1404 and the touch sensor panel will operate in a near field configuration. If no signal is detected, then the flow moves to step S1406 and the touch sensor panel switches its configuration to a self-capacitance far field configuration. At step S1408 the touch sensor panel can be scanned to determine if a signal is present. If a signal is detected, then the flow moves to step S1410 and the touch sensor panel will operate in a far field configuration. If no signal is detected, then the flow moves to step S1412 and the super far field detection method discussed above is used to detect super far field proximity events. At step 1414 the touch sensor panel can be scanned to determine if a signal is present. If a signal is detected, then the flow moves to step S1416 and the touch sensor panel will operate in a super far field mode. If no signal is present, then the flow moves back to step S1400 and the process is repeated.

Figure 15:
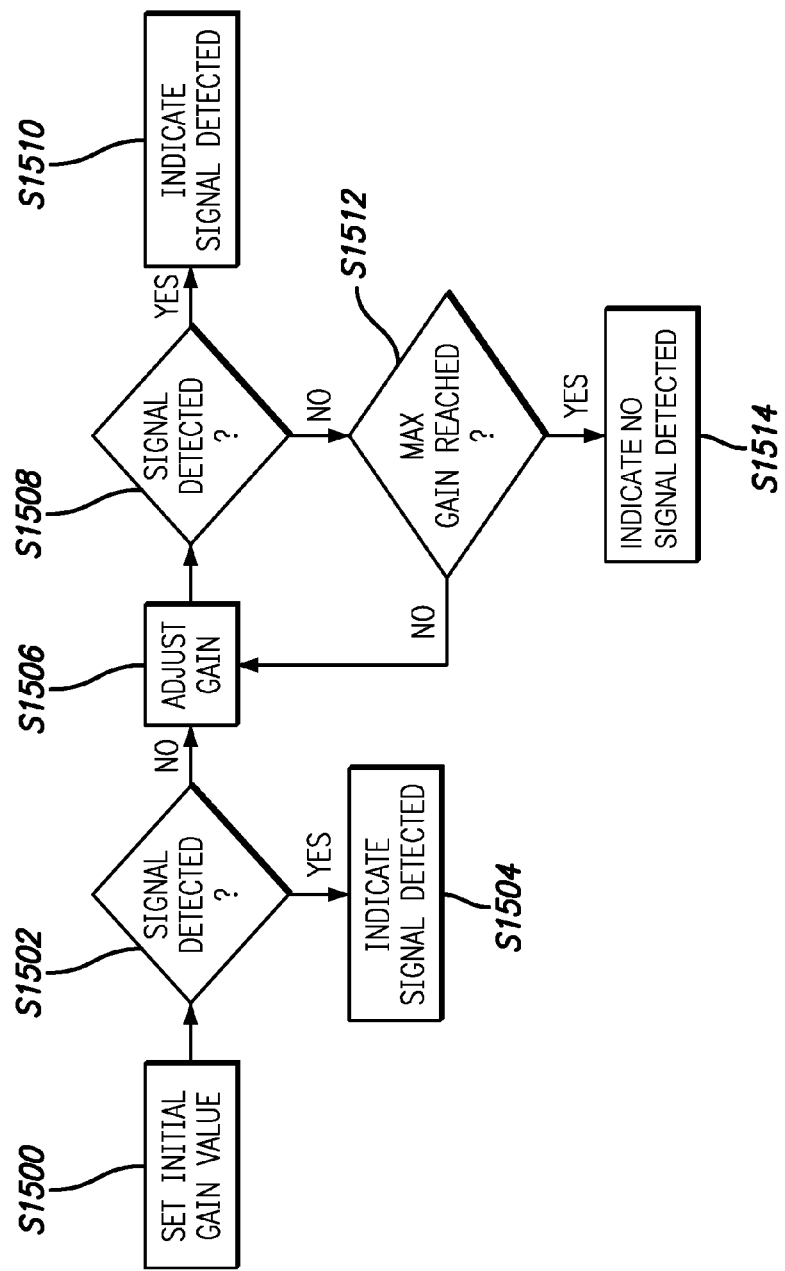
FIG. 15 illustrates a flow diagram for detecting the presence of a touch or proximity signal according to one disclosed exemplary embodiment.

The signal detection steps depicted at S1402 and S1408 can be accomplished using a plurality of methods. FIG. 15 illustrates an exemplary flow diagram for detecting the presence of a touch or proximity signal according to one disclosed embodiment. At step 1500 the gain of amplifier 308 can be set to an initial value. In some embodiments, the gain of amplifier 308 can be set to an initial value by adjusting the value of feedback resistor 312, either by switching out the resistor with a resistor of another value, or employing an adjustable resistor. In other embodiments, the gain of amplifier 308 can be set to an initial value by adjusting the value of feedback capacitor 310, either by switching out the capacitor with a capacitor of another value, or employing an adjustable capacitor. Once the initial gain of amplifier 308 is set, the flow moves to step S1502, where the presence of a touch or proximity signal can be detected. If a signal is detected then the flow will move to step S1504 and the process will indicate that a signal has been detected. If no signal is detected, then the flow will move to step 1506 where the gain will be adjusted using the methods described above. At step 1508 if a signal is detected then the flow will move to step S1510 and the process will indicate that a signal has been detected. If no signal is detected, then the flow moves to step S1512. At step s1512, if the gain of the amplifier is at its maximum possible value, then the flow moves to S1514 and the process indicates that no signal has been detected. If the gain is not at its maximum possible value, then the flow moves back to step S1506 and the gain is adjusted and the process repeats. It should be understood that the above method is only meant to serve as an example, and the presence of a touch or proximity signal can be determined using other methods.

Figure 16:
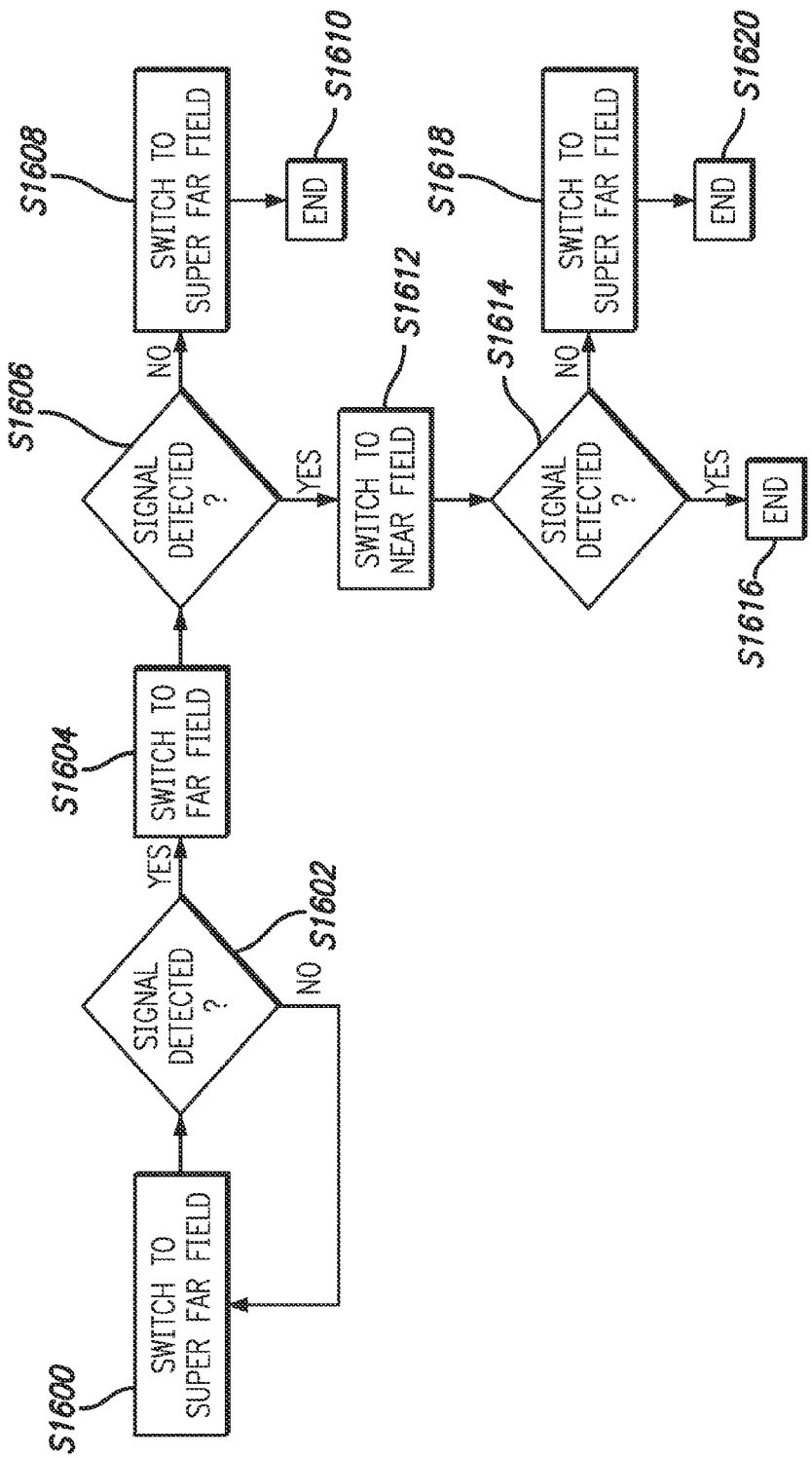
FIG. 16 illustrates yet another flow diagram illustrating an exemplary procedure for switching touch modes during operation of the touch sensor panel according to one disclosed embodiment.

FIG. 16 illustrates yet another exemplary flow diagram illustrating the procedure for switching touch modes during operation of the touch sensor panel according to one disclosed embodiment. As step S1600 the touch sensor panel is switched into a super far field configuration. The flow then moves to step 1602 where the touch sensor panel determines whether a signal has been detected. If no signal has been detected then the flow moves back to step S1600 and the process is repeated. If a signal is detected then the flow moves to step S1604 where the touch sensor panel is configured to operate in a far field sensing mode. At step S1606 the touch sensor panel determines whether a signal has been detected. If no signal has been detected, then the flow moves to step S1608 and the touch sensor panel is switched back to the super far field mode and the process is terminated at step S1610. If a signal is detected then the flow moves to step S1612 and the device is switched to a near field configuration. The flow then moves to step S1614 and the process searches for a signal. If no signal is detected, then the flow moves to step S1618 and the touch sensor panel is switched to a far field configuration and the process is then ended at step 1620. If a signal is detected then the process is stopped at S1616.

Figure 17:
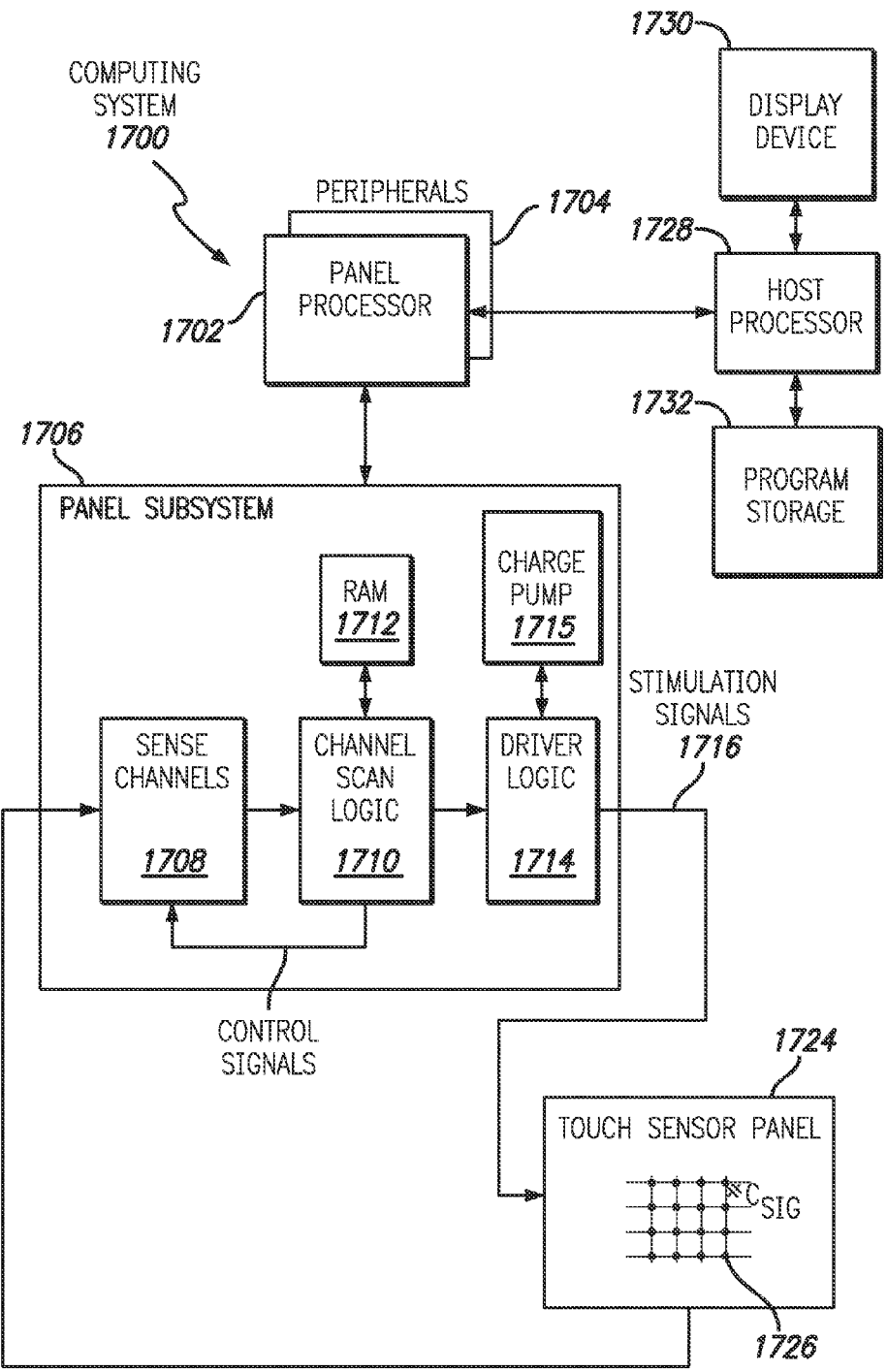
FIG. 17 illustrates an exemplary computing system including a touch sensor panel utilizing touch sensor common mode noise recovery according to one disclosed embodiment.

FIG. 17 illustrates exemplary computing system 1700 that can include one or more of the embodiments described above. Computing system 1700 can include one or more panel processors 1702 and peripherals 1704, and panel subsystem 1706. Peripherals 1704 can include, but are not limited to, random access memory (RAM) or other types of memory or storage, watchdog timers and the like. Panel subsystem 1706 can include, but is not limited to, one or more sense channels 1708 which can utilize operational amplifiers that can be configured to minimize saturation time, channel scan logic 1710 and driver logic 1714. Channel scan logic 1710 can access RAM 1712, autonomously read data from the sense channels and provide control for the sense channels including calibrating the sense channels for changes in phase correlated with a parasitic capacitance. In addition, channel scan logic 1710 can control driver logic 1714 to generate stimulation signals 1716 at various frequencies and phases that can be selectively applied to drive lines of touch sensor panel 1724. In some embodiments, panel subsystem 1706, panel processor 1702 and peripherals 1704 can be integrated into a single application specific integrated circuit (ASIC).

Touch sensor panel 1724 can include a capacitive sensing medium having a plurality of drive lines and a plurality of sense lines, although other sensing media can also be used. Each intersection of drive and sense lines can represent a capacitive sensing node and can be viewed as picture element (node) 1726, which can be particularly useful when touch sensor panel 1724 is viewed as capturing an "image" of touch. Each sense line of touch sensor panel 1724 can drive sense channel 1708 (also referred to herein as an event detection and demodulation circuit) in panel subsystem 1706. The drive and sense lines can also be configured to act as individual electrodes in a self-capacitance touch sensing configuration.

Computing system 1700 can also include host processor 1728 for receiving outputs from panel processor 1702 and performing actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 1728 can also perform additional functions that may not be related to panel processing, and can be coupled to program storage 1732 and display device 404 such as an LCD display for providing a UI to a user of the device. Display device 404 together with touch sensor panel 1724, when located partially or entirely under the touch sensor panel, can form touch screen 1718.

Note that one or more of the functions described above can be performed by firmware stored in memory (e.g. one of the peripherals 1704 in FIG. 17) and executed by panel processor 1702, or stored in program storage 1732 and executed by host processor 1728. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium that can contain or store the program for use by or in connection with the instruction execution system, apparatus, or device. The computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Figure 18A:
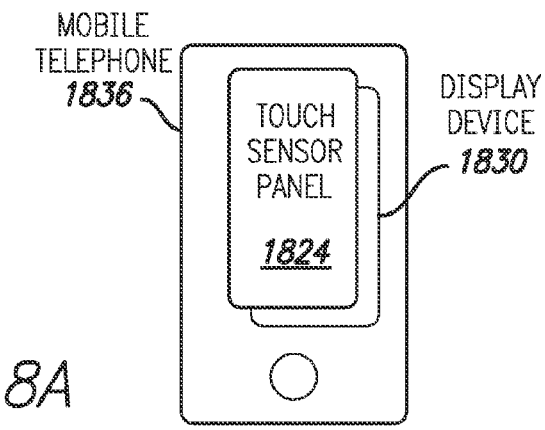
FIG. 18a illustrates an exemplary mobile telephone having a touch sensor panel that includes a touch common mode noise recovery circuit and method according to one disclosed embodiment.

FIG. 18a illustrates exemplary mobile telephone 1836 that can include touch sensor panel 1824 and display device 1830, the touch sensor panel including circuitry to change the configuration of the touch sensor panel from a near field detection scheme to a far field and super far field detection scheme and mitigate the effects of parasitic capacitance according to one disclosed embodiment.

Figure 18B:
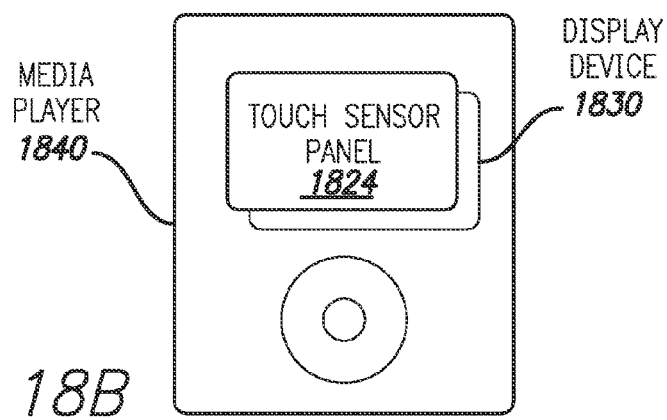
FIG. 18b illustrates an exemplary digital media player having a touch sensor panel that includes a touch common mode noise recovery circuit and method according to one disclosed embodiment.

FIG. 18b illustrates exemplary digital media player 1840 that can include touch sensor panel 1824 and display device 1830, the touch sensor panel including circuitry to change the configuration of the touch sensor panel from a near field detection scheme to a far field and super far field detection scheme and mitigate the effects of parasitic capacitance according to one disclosed embodiment.

Figure 18C:
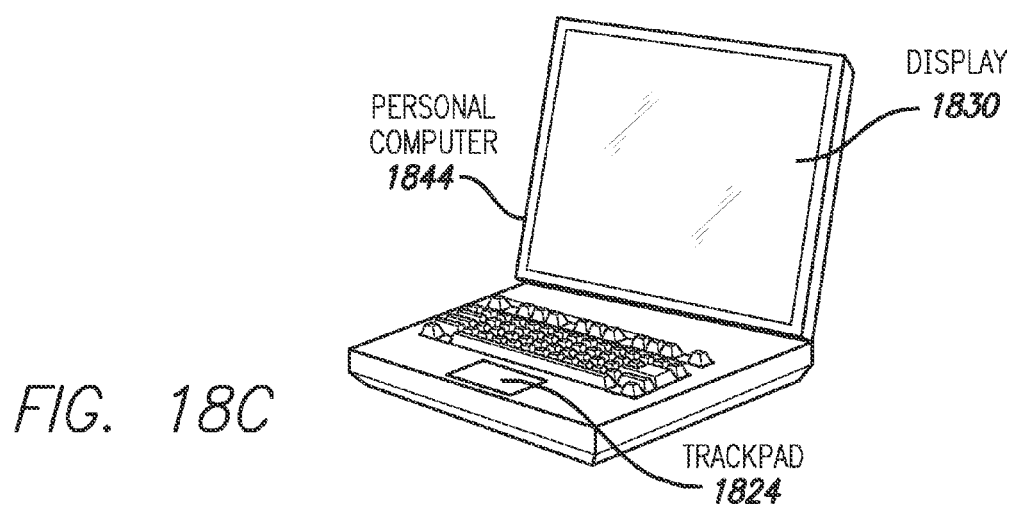
FIG. 18c illustrates an exemplary personal computer having a touch sensor panel that includes a touch common mode noise recovery circuit and method according to one disclosed embodiment.

FIG. 18c illustrates exemplary personal computer 1844 that can include touch sensor panel (trackpad) 1824 and display 1830, the touch sensor panel and/or display of the personal computer (in embodiments where the display is part of a touch screen) including circuitry to change the configuration of the touch sensor panel from a near field detection scheme to a far field and super far field detection scheme and mitigate the effects of parasitic capacitance according to one disclosed embodiment. The mobile telephone, media player and personal computer of FIGS. 12a, 12b and 12c can achieve a wider dynamic range of sensing capabilities by switching its configuration to detect near field and far field events, and mitigating parasitic capacitance.

Although FIGS. 18a-c discuss a mobile telephone, a media player and a personal computer respectively, the disclosure is not so restricted and the touch sensor panel can be included on a tablet computer, a television, or any other device which utilizes the touch sensor panel including circuitry to switch between near field far field sensing configurations and mitigate the effects of parasitic capacitance on the touch sensor panel.

Although the disclosed embodiments have been fully described with reference to the accompanying drawings, it is to be noted that various changes and modifications will become apparent to those skilled in the art. Such changes and modifications are to be understood as being included within the scope of the disclosed embodiments as defined by the appended claims.

What is claimed is:

1. A method for determining an object sensing mode of a touch sensor panel, comprising:
at an electronic device with one or more processors and memory,
operating the touch sensor panel in a first object sensing mode having a first resolution and a first gain,
if no first touch or proximity event is detected in the first object sensing mode, switching the touch sensor panel to operate in a second object sensing mode having a second resolution and a second gain greater than the first gain, and if no second touch or proximity event is detected in the second object sensing mode and the second gain is not a maximum gain, switching the touch sensor panel to operate in the second object sensing mode having a third gain greater than the second gain.

2. The method of claim 1, further comprising:

if no second touch or proximity event is detected in the second object sensing mode, switching the touch sensor panel to operate in a third object sensing mode having a third resolution.

3. The method of claim 2, further comprising:

if no third touch or proximity event is detected in the third object sensing mode, switching the touch sensor panel to operate in the first object sensing mode.

4. The method of claim 1, wherein the first and second resolutions are different levels of x-y location resolution.

5. The method of claim 1, wherein the first and second resolutions are different levels of z proximity resolution.

6. The method of claim 1, wherein the first, second and third object sensing modes are selected from the group consisting of a super-far field mode, a far field mode, and a near field mode.

7. The method of claim 1, wherein switching the touch sensor panel to operate between the first and second object sensing modes comprises switching between a mutual capacitance touch detection architecture and a self-capacitance touch detection architecture.

8. An apparatus for determining an object sensing mode of a touch sensor panel, comprising:

switching circuitry configured to switch the touch sensor panel between a plurality of object sensing modes; and a processor communicatively coupled to the switching circuitry and capable of configuring the switching circuitry to operate the touch sensor panel in a first object sensing mode having a first resolution and a first gain, if no first touch or proximity event is detected in the first object sensing mode, configuring the switching circuit to operate the touch sensor panel in a second object sensing mode having a second resolution and a second gain greater than the first gain, and if no second touch or proximity event is detected in the second object sensing mode and the second gain is not a maximum gain, configuring the switching circuitry to operate the touch sensor panel in the second object sensing mode having a third gain greater than the second gain.

9. The apparatus of claim 8, wherein the processor is further capable of configuring the switching circuitry to operate the touch sensor panel in a third object sensing mode having a third resolution, if no second touch or proximity event is detected in the second object sensing mode.

10. The apparatus of claim 9, wherein the processor is further capable of switching the touch sensor panel to operate in the first object sensing mode, if no third touch or proximity event is detected in the third object sensing mode.

11. The apparatus of claim 8, wherein the first and second resolutions are different levels of x-y location resolution.

12. The apparatus of claim 8, wherein the first and second resolutions are different levels of z proximity resolution.

13. The apparatus of claim 8, wherein the first, second and third object sensing modes are selected from the group consisting of a super-far field mode, a far field mode, and a near field mode.

14. The apparatus of claim 8, wherein switching the touch sensor panel to operate between the first and second object sensing modes comprises switching between a mutual capacitance touch detection architecture and a self-capacitance touch detection architecture.

15. A non-transitory computer readable storage medium having stored thereon a set of instructions for determining an object sensing mode of a touch sensor panel that when executed by a processor causes the processor to:

operate the touch sensor panel in a first object sensing mode having a first resolution and a first gain;

if no first touch or proximity event is detected in the first object sensing mode, switch the touch sensor panel to operate in a second object sensing mode having a second resolution and a second gain greater than the first gain; and if no second touch or proximity event is detected in the second object sensing mode and the second gain is not a maximum gain, switch the touch sensor panel to operate in the second object sensing mode having a third gain greater than the second gain.

16. The non-transitory computer readable storage medium of claim 15, wherein the processor is further caused to switch the touch sensor panel to operate in a third object sensing mode having a third resolution, if no second touch or proximity event is detected in the second object sensing mode.

17. The non-transitory computer readable storage medium of claim 16, wherein the processor is further caused to switch the touch sensor panel back to operate in the first object sensing mode, if no third touch or proximity event is detected in the third object sensing mode.

18. The non-transitory computer readable storage medium of claim 15, wherein the first and second resolutions are different levels of x-y location resolution.

19. The non-transitory computer readable storage medium of claim 15, wherein the first and second resolutions are different levels of z proximity resolution.

20. The non-transitory computer readable storage medium of claim 15, wherein the first, second and third object sensing modes are selected from the group consisting of a super-far field mode, a far field mode and a near field mode.

21. The non-transitory computer readable storage medium of claim 15, wherein switching the touch sensor panel to operate between the first and second object sensing modes comprises switching between a mutual capacitance touch detection architecture and a self-capacitance architecture.

* * * * *

UNITED STATES PATENT AND TRADEMARK OFFICE
CERTIFICATE OF CORRECTION

PATENT NO. : 9,569,053 B2  
APPLICATION NO. : 14/788642  
DATED : February 14, 2017  
INVENTOR(S) : Elias et al.

Page 1 of 1

It is certified that error appears in the above-identified patent and that said Letters Patent is hereby corrected as shown below:

In the Claims

Column 18, Claim 17, Line 39, delete the word "back" between the word "panel" and the word "to."

Signed and Sealed this
Twenty-third Day of May, 2017

Michelle K. Lee
*Director of the United States Patent and Trademark Office*